United States Patent
Chiang et al.

(10) Patent No.: US 11,329,165 B2
(45) Date of Patent: May 10, 2022

(54) STRUCTURE AND FORMATION METHOD OF SEMICONDUCTOR DEVICE WITH ISOLATION STRUCTURE

(71) Applicant: Taiwan Semiconductor Manufacturing Co., Ltd., Hsinchu (TW)

(72) Inventors: Kuo-Cheng Chiang, Zhubei (TW); Huan-Chieh Su, Tianzhong Township, Changhua County (TW); Kuan-Ting Pan, Taipei (TW); Shi-Ning Ju, Hsinchu (TW); Chih-Hao Wang, Baoshan Township, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/801,423

(22) Filed: Feb. 26, 2020

(65) Prior Publication Data
US 2021/0265508 A1    Aug. 26, 2021

(51) Int. Cl.
*H01L 29/66* (2006.01)
*H01L 29/423* (2006.01)
*H01L 29/78* (2006.01)
*H01L 29/786* (2006.01)

(52) U.S. Cl.
CPC .. *H01L 29/78651* (2013.01); *H01L 29/42384* (2013.01); *H01L 29/785* (2013.01); *H01L 2029/7858* (2013.01)

(58) Field of Classification Search
CPC ................................................ H01L 29/42392
See application file for complete search history.

(56) References Cited

U.S. PATENT DOCUMENTS

| | | |
|---|---|---|
| 9,209,247 B2 | 12/2015 | Colinge |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |

(Continued)

*Primary Examiner* — Moin M Rahman
*Assistant Examiner* — Mohammad A Rahman
(74) *Attorney, Agent, or Firm* — Birch, Stewart, Kolasch & Birch, LLP

(57) ABSTRACT

A semiconductor device structure is provided, which includes a first fin structure over a semiconductor substrate. The first fin structure has multiple first semiconductor nanostructures suspended over the semiconductor substrate. The semiconductor device structure includes a second fin structure over the semiconductor substrate, and the second fin structure has multiple second semiconductor nanostructures suspended over the semiconductor substrate. The semiconductor device structure includes a dielectric fin between the first fin structure and the second fin structure. In addition, the semiconductor device structure includes a metal gate stack wrapping around the first fin structure, the second fin structure, and the dielectric fin. The semiconductor device structure includes a dielectric protection structure over the metal gate stack. The semiconductor device structure also includes an insulating structure penetrating through a bottom surface of the dielectric protection structure and extending into the metal gate stack to be aligned with the dielectric fin.

20 Claims, 29 Drawing Sheets

(56) References Cited

U.S. PATENT DOCUMENTS

| | | | |
|---|---|---|---|
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2018/0261514 A1* | 9/2018 | Xie | H01L 29/517 |
| 2019/0043975 A1* | 2/2019 | George | H01L 29/82 |
| 2019/0378903 A1* | 12/2019 | Jeon | H01L 21/764 |
| 2020/0083222 A1* | 3/2020 | Kim | H01L 29/66545 |
| 2020/0219978 A1* | 7/2020 | Guler | H01L 21/02236 |

* cited by examiner

STRUCTURE AND FORMATION METHOD OF SEMICONDUCTOR DEVICE WITH ISOLATION STRUCTURE

BACKGROUND

The semiconductor integrated circuit (IC) industry has experienced rapid growth. Technological advances in IC materials and design have produced generations of ICs. Each generation has smaller and more complex circuits than the previous generation.

Over the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
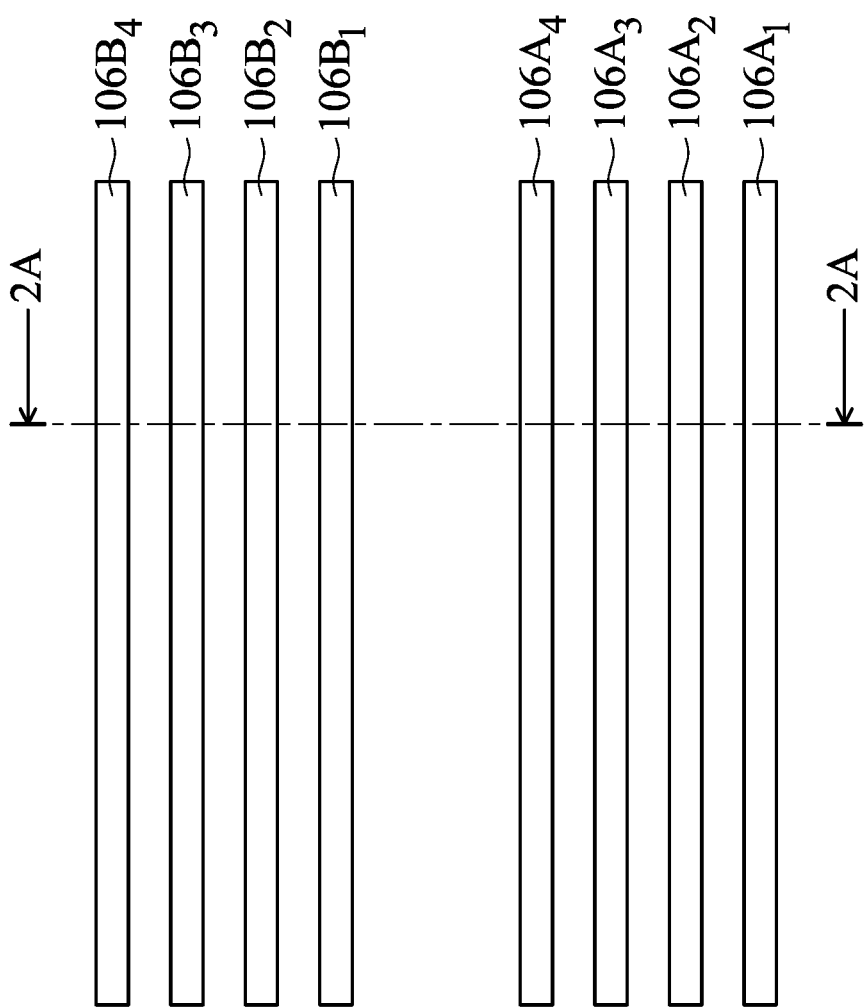
FIGS. 1A-1C are top views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

Embodiments of the disclosure may relate to FinFET structure having fins. The fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. However, the fins may be formed using one or more other applicable processes.

Embodiments of the disclosure may relate to the gate all around (GAA) transistor structures. The GAA structure may be patterned using any suitable method. For example, the structures may be patterned using one or more photolithography processes, including double-patterning or multi-patterning processes. In some embodiments, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 1B:
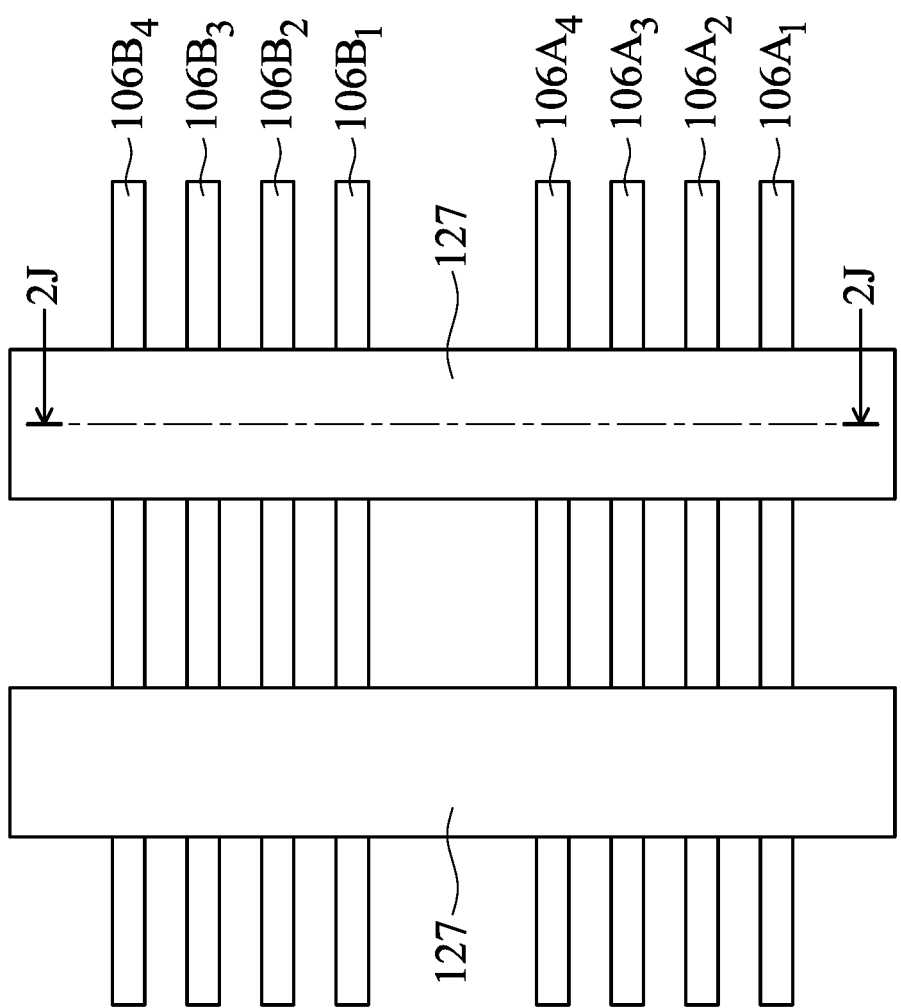
Figure 1C:
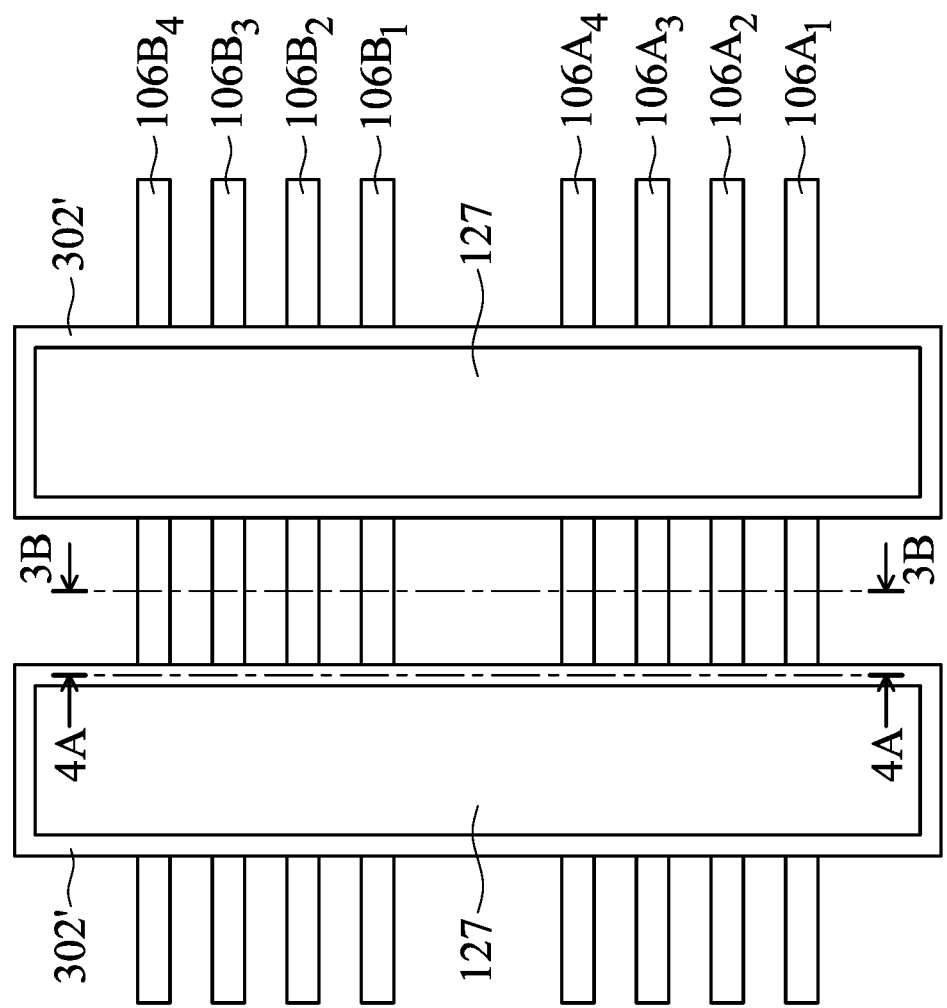
Figure 2A:
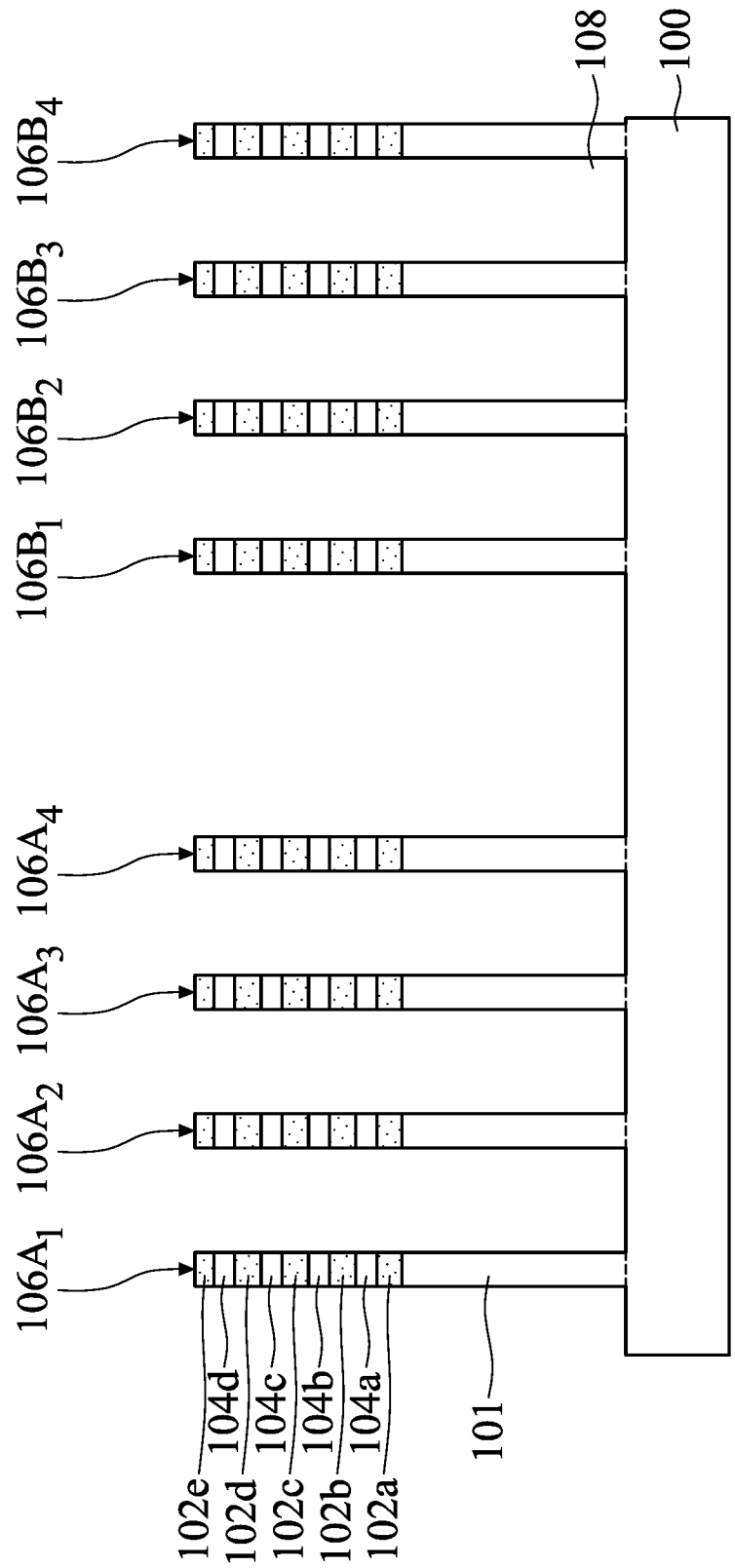
FIGS. 2A-2S are cross-sectional views of various stages of a process for forming a semiconductor device structure, in accordance with some embodiments.

FIGS. 1A-1C are top views of various stages of a process for forming a semiconductor device structure, in accordance with some embodiments. FIGS. 2A-2S are cross-sectional views of various stages of a process for forming a semiconductor device structure, in accordance with some embodiments. In some embodiments, FIG. 2A is a cross-sectional view of the structure taken along the line 2A-2A in FIG. 1A.

As shown in FIG. 2A, a semiconductor substrate 100 is received or provided. In some embodiments, the semiconductor substrate 100 is a bulk semiconductor substrate, such as a semiconductor wafer. The semiconductor substrate 100 may include silicon or other elementary semiconductor materials such as germanium. The semiconductor substrate 100 may be un-doped or doped (e.g., p-type, n-type, or a combination thereof). In some embodiments, the semiconductor substrate 100 includes an epitaxially grown semiconductor layer on a dielectric layer. The epitaxially grown semiconductor layer may be made of silicon germanium, silicon, germanium, one or more other suitable materials, or a combination thereof.

In some other embodiments, the semiconductor substrate 100 includes a compound semiconductor. For example, the compound semiconductor includes one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions. Each of them is greater than or equal to zero, and added together they equal 1. The compound semiconductor may include silicon carbide, gallium arsenide, indium arsenide, indium phosphide, one or more other suitable compound semiconductors, or a combination thereof. Other suitable substrate including II-VI compound semiconductors may also be used.

In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 100 includes a multi-layered structure. For example, the semiconductor substrate 100 includes a silicon-germanium layer formed on a bulk silicon layer.

In some embodiments, a semiconductor stack having multiple semiconductor layers is formed over the semiconductor substrate 100, in accordance with some embodiments. In some embodiments, the semiconductor stack includes multiple sacrificial layers 102a, 102b, 102c, 102d, and 102e. The semiconductor stack also includes multiple semiconductor layers 104a, 104b, 104c, and 104d. In some embodiments, the sacrificial layers 102a-102e and the semiconductor layers 104a-104d are laid out alternately.

In some embodiments, each of the sacrificial layers 102a-102e and the semiconductor layers 104a-104d has substantially the same thickness. In some embodiments, each of the semiconductor layers 104a-104d is thicker than each of the sacrificial layers 102a-102e. In some other embodiments, each of the sacrificial layers 102a-102e is thicker than each of the semiconductor layers 104a-104d.

In some embodiments, the sacrificial layers 102a-102e and the semiconductor layers 104a-104d are made of different materials. In some embodiments, the sacrificial layers 102a-102e are made of or include silicon germanium or germanium, and the semiconductor layers 104a-104d are made of or include silicon.

In some embodiments, the sacrificial layers 102a-102e and the semiconductor layers 104a-104d are formed using multiple epitaxial growth operations. Each of the sacrificial layers 102a-102e and the semiconductor layers 104a-104d may be formed using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, one or more other applicable processes, or a combination thereof.

In some embodiments, the sacrificial layers 102a-102e and the semiconductor layers 104a-104d are grown in-situ in the same process chamber. In some embodiments, the growth of the sacrificial layers 102a-102e and the growth of the semiconductor layers 104a-104d are alternately and sequentially performed in the same process chamber to complete the formation of the semiconductor stack. In some embodiments, the vacuum of the process chamber is not broken before the epitaxial growth of the semiconductor stack is accomplished.

Afterwards, a patterned hard mask element is formed over the semiconductor stack to assist in a subsequent patterning of the semiconductor stack. One or more etching processes are used to pattern the semiconductor stack into multiple fin structures $106A_1$, $106A_2$, $106A_3$, $106A_4$, $106B_1$, $106B_2$, $106B_3$ and $106B_4$, as shown in FIG. 2A in accordance with some embodiments. FIG. 1A shows the top view of these fin structures $106A_1$-$106A_4$ and $106B_1$-$106B_4$. In some embodiments, the fin structures $106A_1$-$106A_4$ and $106B_1$-$106B_4$ extend along directions that are substantially parallel to each other, as shown in FIG. 1A. In some embodiments, the distance between the fin structures $106A_4$ and $106B_1$ is greater than the distance between the fin structures $106A_3$ and $106A_4$ or between the fin structures $106B_1$ and $106B_2$.

In some embodiments, each of the fin structures $106A_1$-$106A_4$ and $106B_1$-$106B_4$ includes portions of the sacrificial layers 102a-102e, portions of the semiconductor layers 104a-104d, and semiconductor fins 101. In some embodiments, the semiconductor substrate 100 is also partially removed during the etching process for forming the fin structures $106A_1$-$106A_4$ and $106B_1$-$106B_4$. Protruding portions of the semiconductor substrate 100 that remain form the semiconductor fins 101.

Figure 2B:
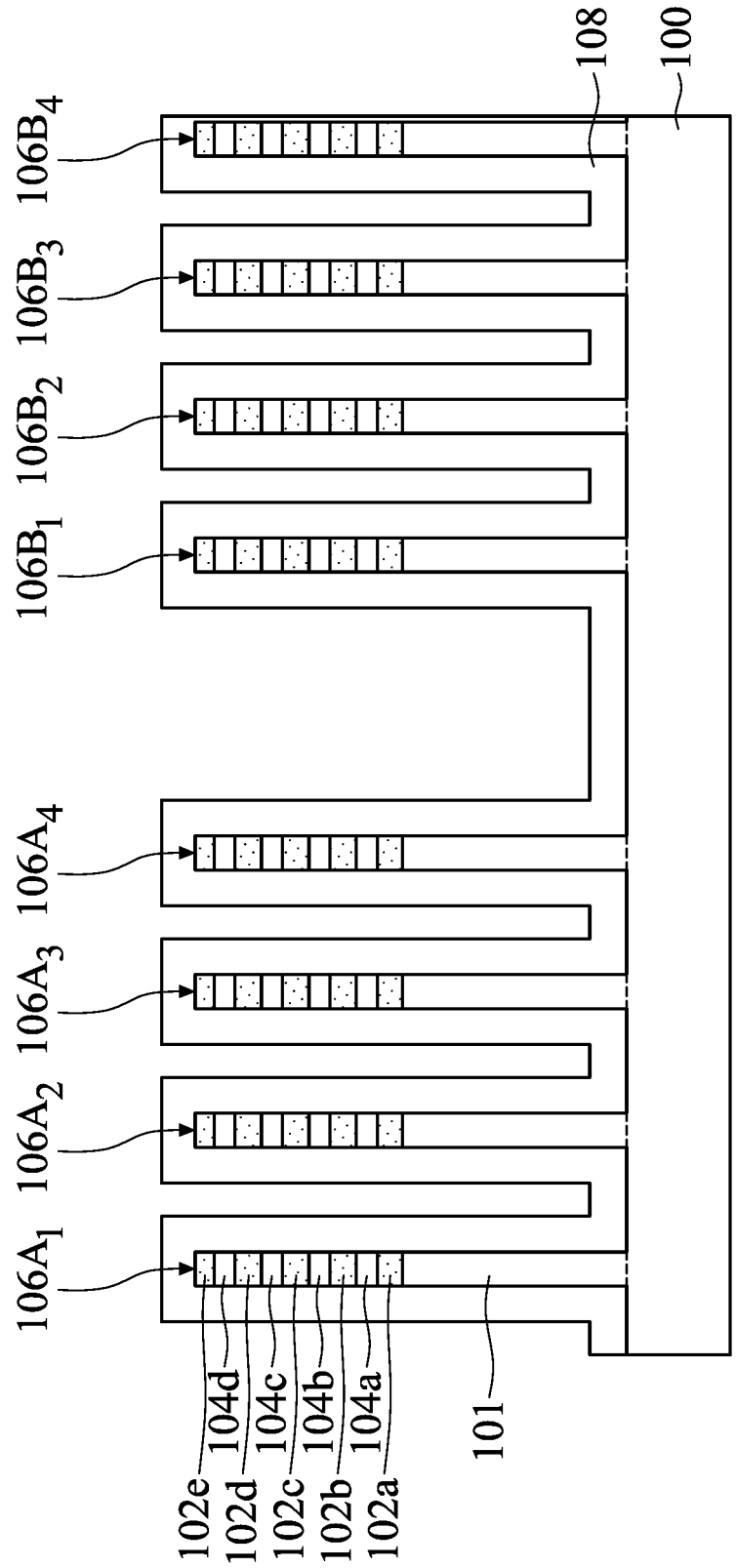

As shown in FIG. 2B, a dielectric layer 108 is deposited over the structure shown in FIG. 2A, in accordance with some embodiments. The dielectric layer 108 may extend conformally along the sidewalls and tops of the fin structures $106A_1$-$106A_4$ and $106B_1$-$106B_4$. The dielectric layer 108 may be made of or include silicon oxide, silicon carbide, silicon oxycarbide, one or more other suitable materials, or a combination thereof. The dielectric layer 108 may be deposited or formed using a chemical vapor deposition (CVD) process, an atomic layer deposition (ALD) process, a thermal oxidation process, one or more other applicable processes, or a combination thereof.

Figure 2C:
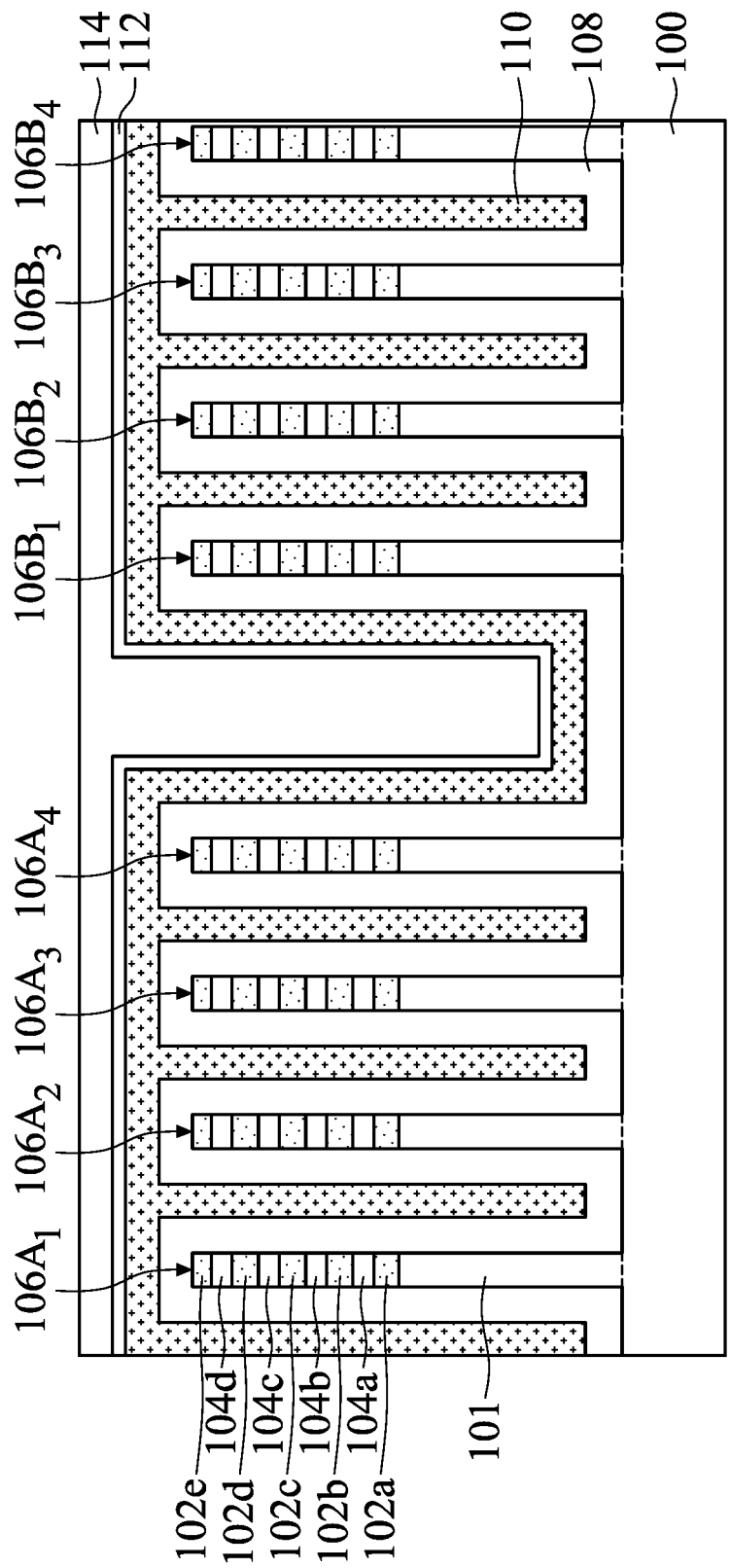

As shown in FIG. 2C, dielectric layers 110, 112, and 114 are sequentially deposited over the structure shown in FIG. 2B, in accordance with some embodiments. In some embodiments, the dielectric layer 110 completely fills the space between the fin structures $106A_1$-$106A_4$ and the space between the fin structures $106B_1$-$106B_4$. The dielectric layer 110 partially fills the space between the fin structures $106A_4$ and $106B_1$. In some embodiments, the dielectric layers 112 and 114 together fill the remaining space between the fin structures $106B_1$-$106B_4$. The dielectric layer 112 may be used as an adhesion layer between the dielectric layers 110 and 114. The dielectric layer 112 may also have other functions.

However, embodiments of the disclosure are not limited thereto. In some other embodiments, the dielectric layer 112 is not formed.

The dielectric layer 110 may be made of or include silicon nitride, silicon oxynitride, carbon-containing silicon nitride, carbon-containing silicon oxynitride, one or more other suitable materials, or a combination thereof. The dielectric layer 110 may be deposited using a CVD process, an ALD process, one or more other applicable processes, or a combination thereof. The dielectric layer 114 may be made of or include silicon oxide, silicon carbide, silicon oxycarbide, one or more other suitable materials, or a combination thereof. The dielectric layer 114 may be deposited using a flowable chemical vapor deposition (FCVD) process, a CVD process, an ALD process, one or more other suitable materials, or a combination thereof. The dielectric layer 112 may be made of or include a material that has good adhesion to the dielectric layers 110 and 114. The dielectric layer 112 may be deposited using a CVD process, an ALD process, one or more other applicable processes, or a combination thereof.

Figure 2D:
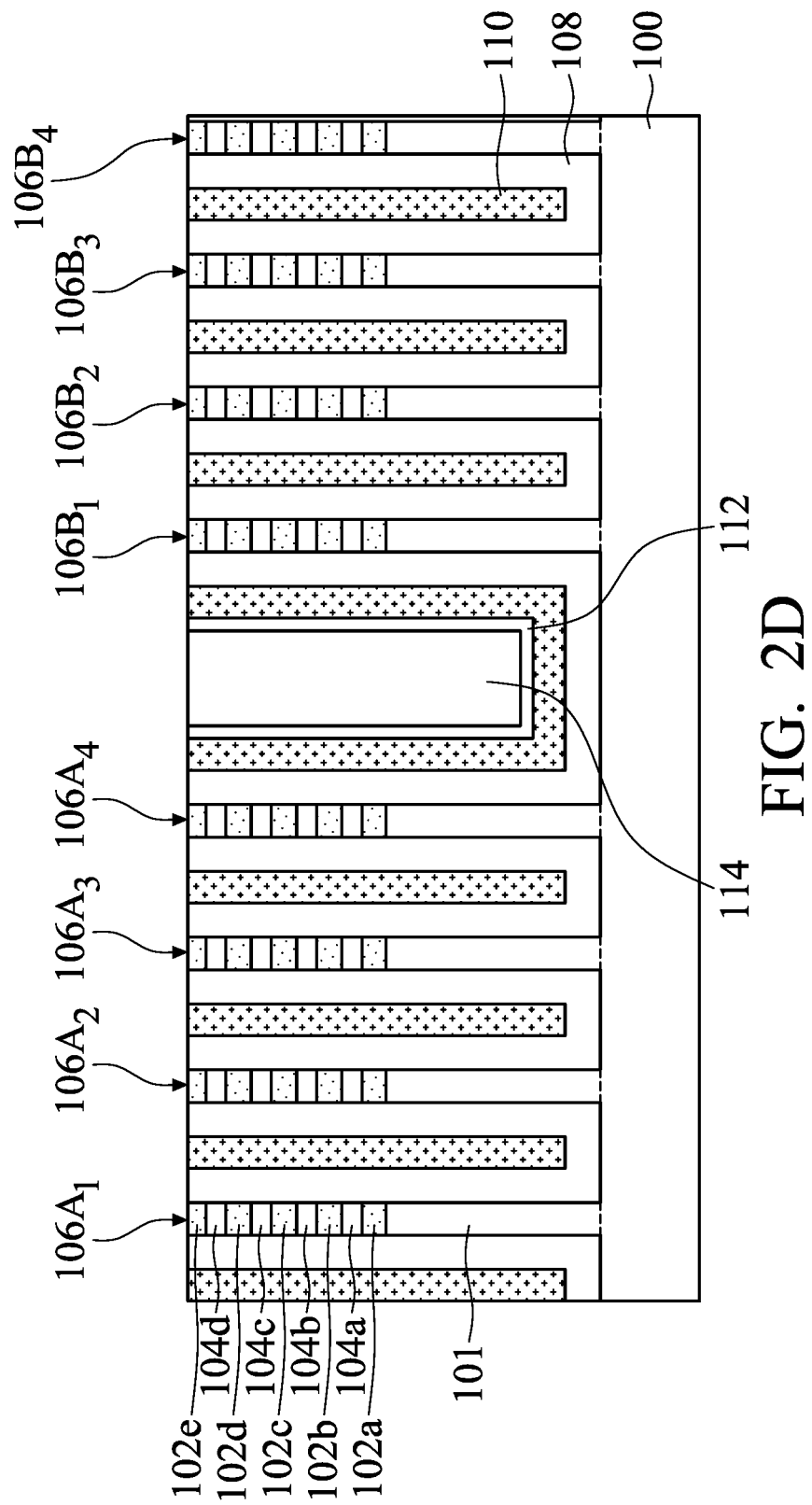

As shown in FIG. 2D, a planarization process is used to partially remove the dielectric layers 108, 110, 112, and 114, in accordance with some embodiments. After the planarization process, the top surfaces of the dielectric layers 108, 110, 112, and 114 and the tops of the fin structures $106A_1$-$106A_4$ and $106B_1$-$106B_4$ are substantially level with each other. The planarization process may include a chemical mechanical polishing (CMP) process, a grinding process, a dry polishing process, an etching process, one or more other applicable processes, or a combination thereof.

Figure 2E:
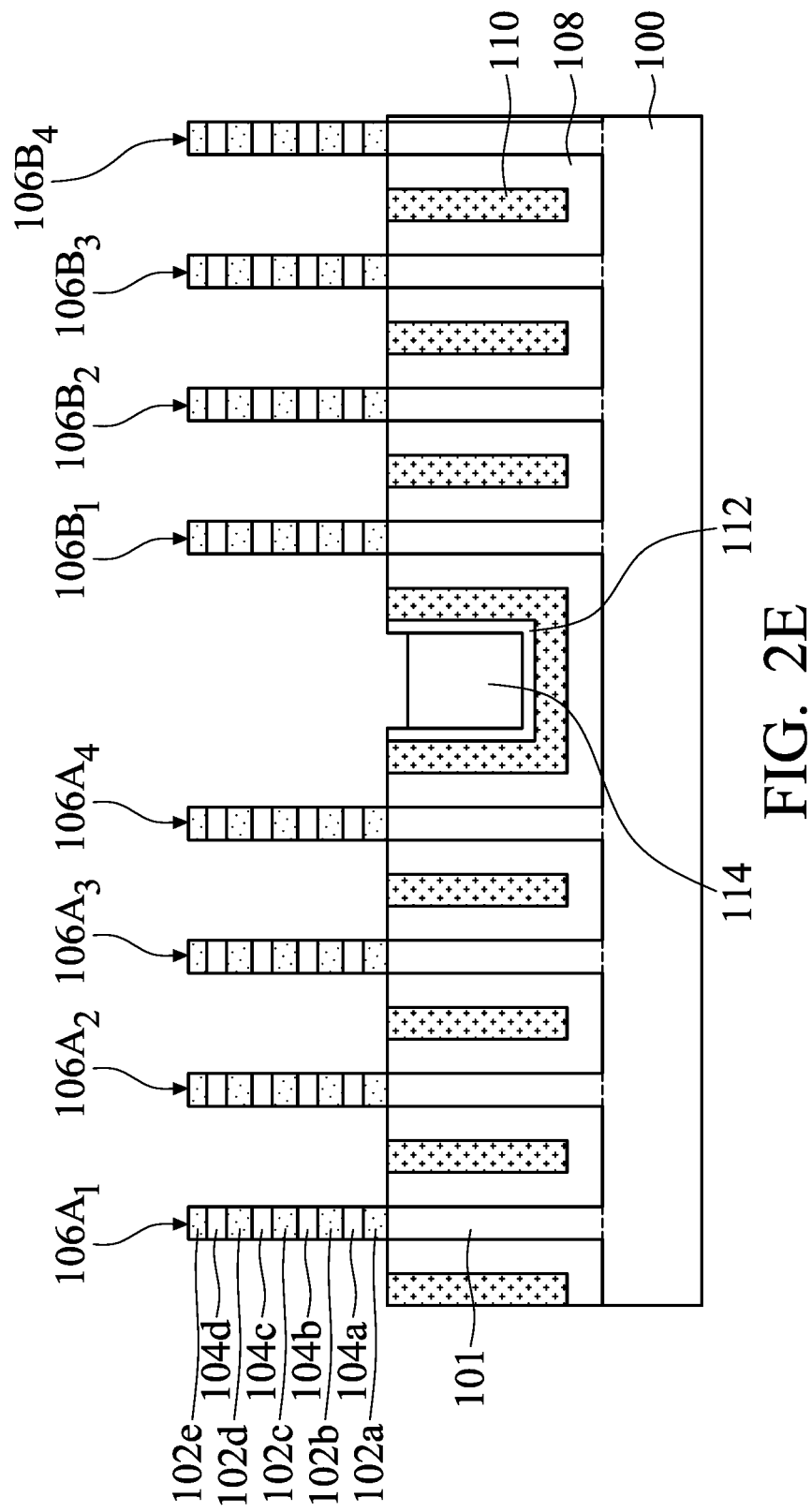

As shown in FIG. 2E, the dielectric layers 108, 110, 112, and 114 are recessed, in accordance with some embodiments. One or more etching processes may be used to recess the dielectric layers 108, 110, 112, and 114. The remaining portions of the dielectric layers 108, 110, 112, and 114 together form an isolation structure that surround lower portions of the fin structures $106A_1$-$106A_4$ and $106B_1$-$106B_4$. In some embodiments, the semiconductor fins 101 are surrounded by the isolation structure, and the remaining portions of the fin structures $106A_1$-$106A_4$ and $106B_1$-$106B_4$ protrude from the top surface of the isolation structure.

Figure 2F:
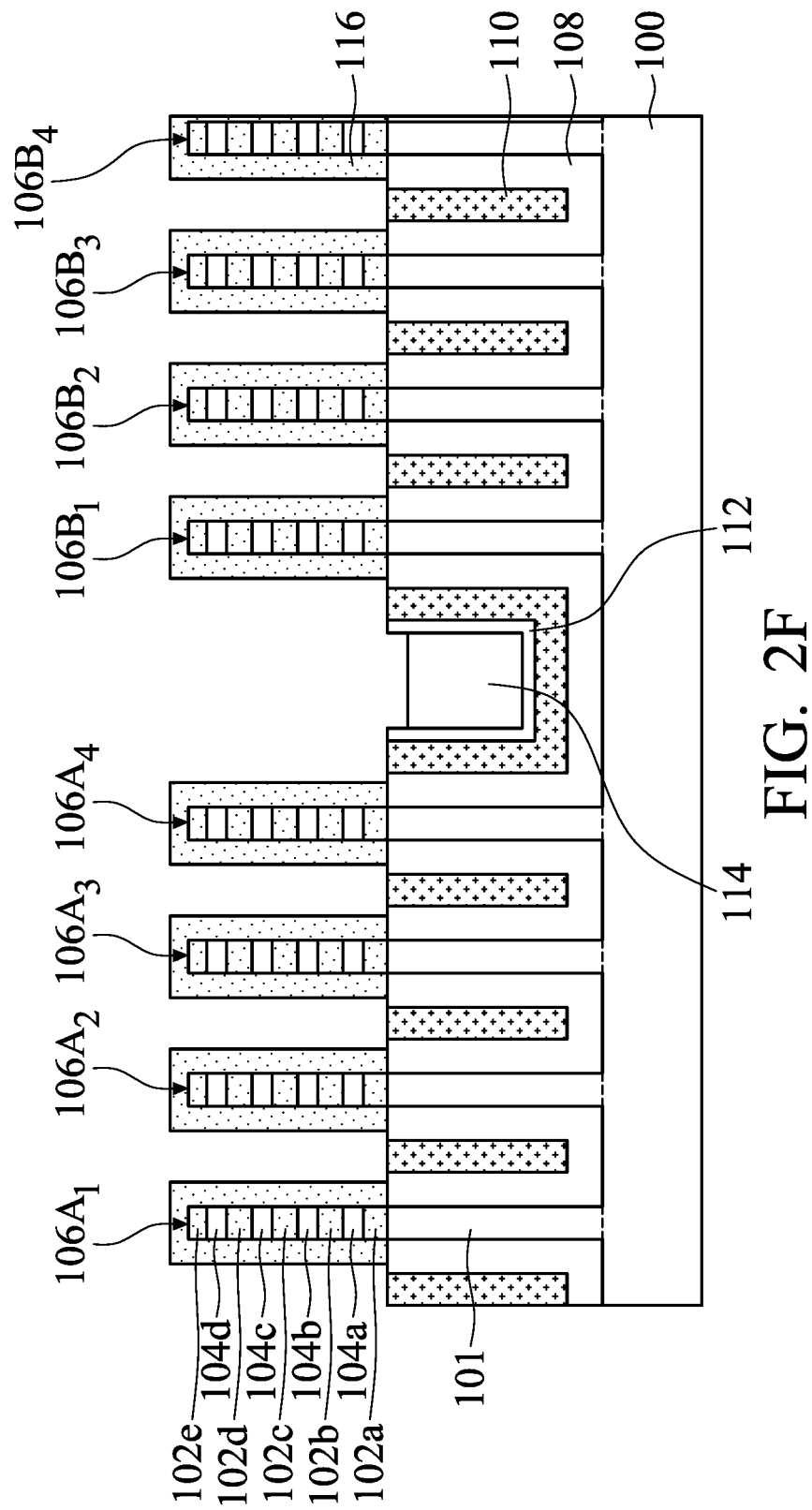

As shown in FIG. 2F, a sacrificial material 116 is formed on the fin structures $106A_1$-$106A_4$ and $106B_1$-$106B_4$, in accordance with some embodiments. In some embodiments, the sacrificial material 116 is selectively formed only on the semiconductor materials. In some embodiments, the sacrificial material 116 is epitaxially grown on the surfaces of the fin structures $106A_1$-$106A_4$ and $106B_1$-$106B_4$. The material and formation method of the sacrificial material 116 may be the same as or similar to those of the sacrificial layers $102a$-$102e$. A suitable epitaxial growth time is used to form the sacrificial material 116 to ensure that the sacrificial material 116 is formed to have a suitable thickness.

Figure 2G:
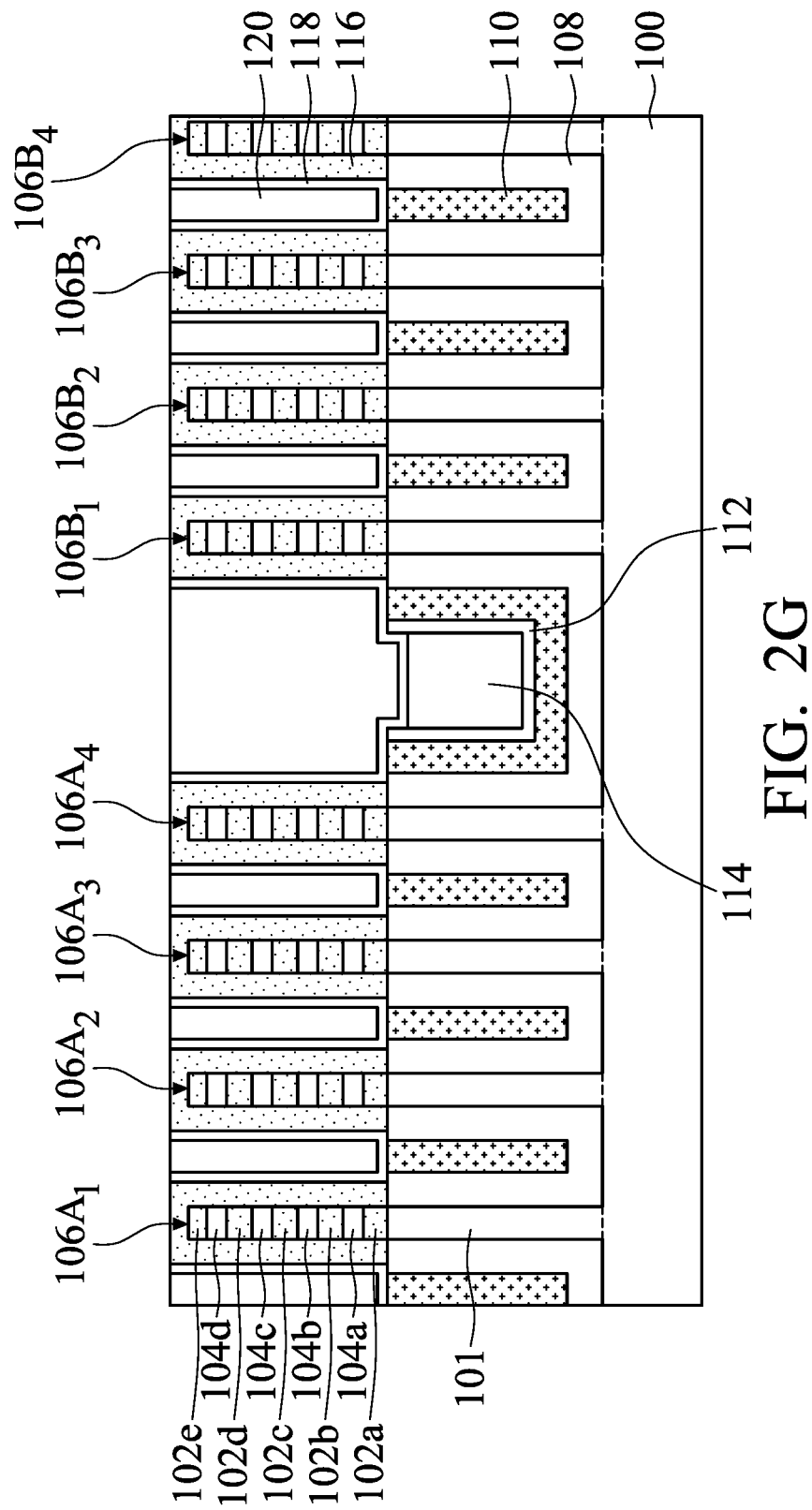

Afterwards, dielectric layers 118 and 120 are sequentially deposited over the structure shown in FIG. 2F, in accordance with some embodiments. Then, a planarization process is used to partially remove the dielectric layers 118 and 120. As a result, the structure shown in FIG. 2G is formed, in accordance with some embodiments. In some embodiments, after the planarization process, the top surfaces of the sacrificial material 116 and the dielectric layers 118 and 120 are substantially level with each other. The planarization process may include a CMP process, a grinding process, a dry polishing process, an etching process, one or more other applicable processes, or a combination thereof.

The dielectric layer 118 may be made of or include silicon nitride, silicon oxynitride, carbon-containing silicon nitride, carbon-containing silicon oxynitride, one or more other suitable materials, or a combination thereof. The dielectric layer 118 may be deposited using a CVD process, an ALD process, one or more other applicable processes, or a combination thereof. The dielectric layer 120 may be made of or include silicon oxide, silicon carbide, silicon oxycarbide, silicon nitride, silicon oxynitride, carbon-containing silicon nitride, carbon-containing silicon oxynitride, one or more other suitable materials, or a combination thereof. The dielectric layer 120 may be deposited using an FCVD process, a CVD process, an ALD process, one or more other suitable materials, or a combination thereof.

Figure 2H:
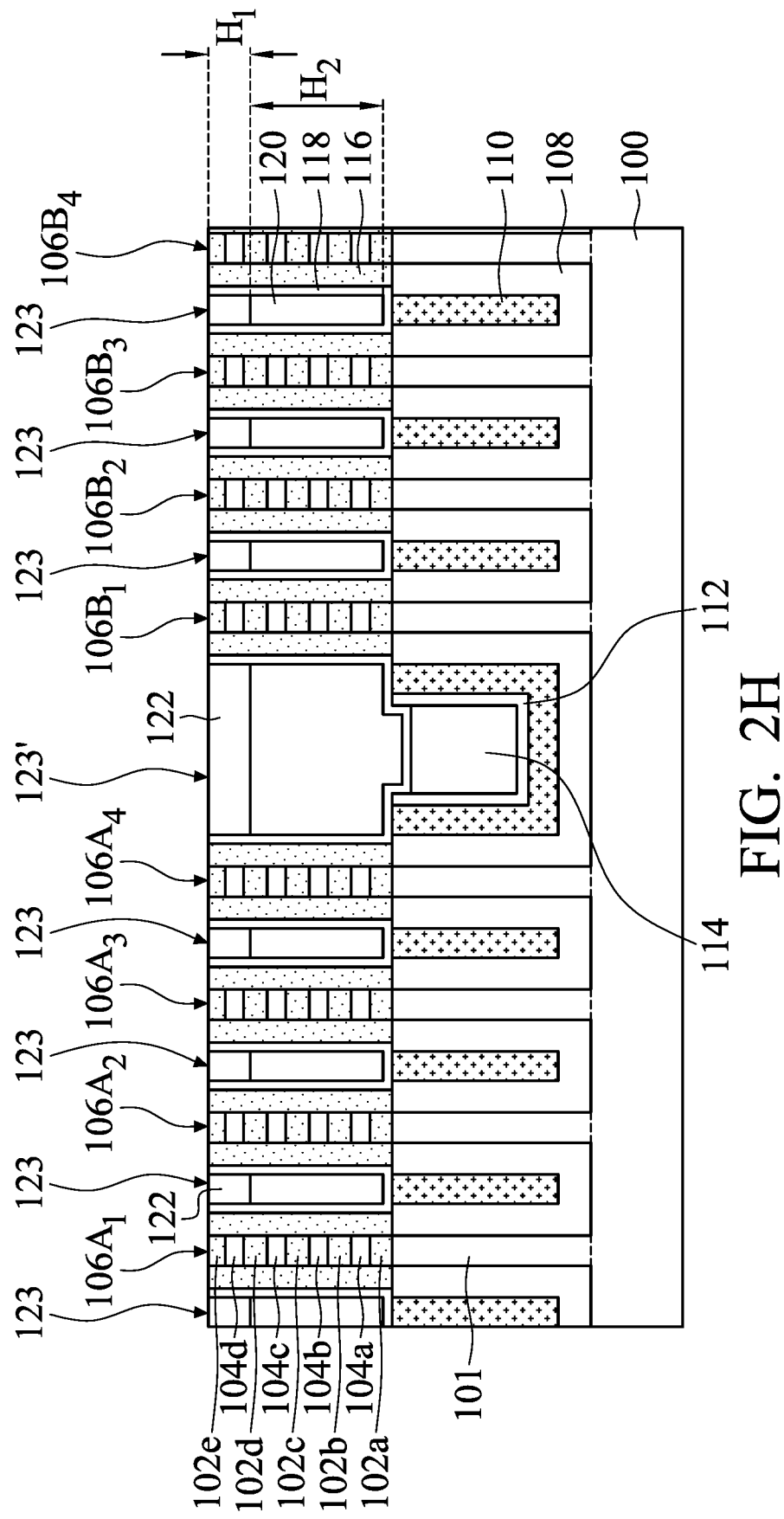

Afterwards, the dielectric layer 120 is partially removed, in accordance with some embodiments. After the removal of the upper portions of the dielectric layer 120, multiple recesses are formed. Then, protection structures 122 are formed in the recesses, as shown in FIG. 2H in accordance with some embodiments.

In some embodiments, a protection layer is deposited to overfill the recesses. Afterwards, a planarization process is used to remove the portion of the protection layer outside of the recesses. As a result, the remaining portions of the protection layer in the recesses form the protection structures 122. The planarization process may include a CMP process, a grinding process, a dry polishing process, an etching process, one or more other applicable processes, or a combination thereof.

In some embodiments, the protection layer used for forming the protection structures 122 has a dielectric constant that is different than that of the dielectric layer 118. In some embodiments, the protection layer used for forming the protection structures 122 has a greater dielectric constant than that of the dielectric layer 118. The protection structures 122 may have a dielectric constant that is greater than about 7. The protection layer used for forming the protection structures 122 may be made of or include hafnium oxide, zirconium oxide, aluminum hafnium oxide, aluminum oxide, hafnium silicon oxide, one or more other suitable materials, or a combination thereof. The protection layer used for forming the protection structures 122 may be deposited using a CVD process, an ALD process, one or more other applicable processes, or a combination thereof.

However, embodiments of the disclosure are not limited thereto. Many variations and/or modifications can be made to embodiments of the disclosure. In some other embodiments, the protection layer used for forming the protection structures 122 has a lower dielectric constant than that of the dielectric layer 118.

As shown in FIG. 2H, multiple dielectric fins 123 and 123' are formed, in accordance with some embodiments. The dielectric fins 123 and 123' are formed in the space between two nearby fin structures. The dielectric fin 123' is formed between the fin structures $106A_4$ and $106B_1$. In some embodiments, the dielectric fin 123' is wider than each of the dielectric fins 123.

Each of the dielectric fins 123 and 123' includes an upper portion (such as the protection structure 122) and a lower portion (such as the dielectric layer 120 below the corresponding protection structure 122). As shown in FIG. 2H, the upper portion has a height $H_1$, and the lower portion has a height $H_2$. In some embodiments, the height $H_1$ is lower than the height $H_2$, as shown in FIG. 2H. However, embodiments of the disclosure are not limited thereto. In some other embodiments, the height $H_2$ is lower than the height $H_1$. The ratio ($H_1/H_2$) of the height $H_1$ to the height $H_2$ may be in a range from about 1/20 to about 20.

Each of the dielectric fins 123 and 123' may further include a liner layer (i.e., the dielectric layer 118). The linear layer (i.e., the dielectric layer 118) extends along sidewalls of the upper portion (such as the protection structure 122), sidewalls of the lower portion (such as the dielectric layer 120), and the bottom of the lower portion (such as the dielectric layer 120).

Figure 2I:
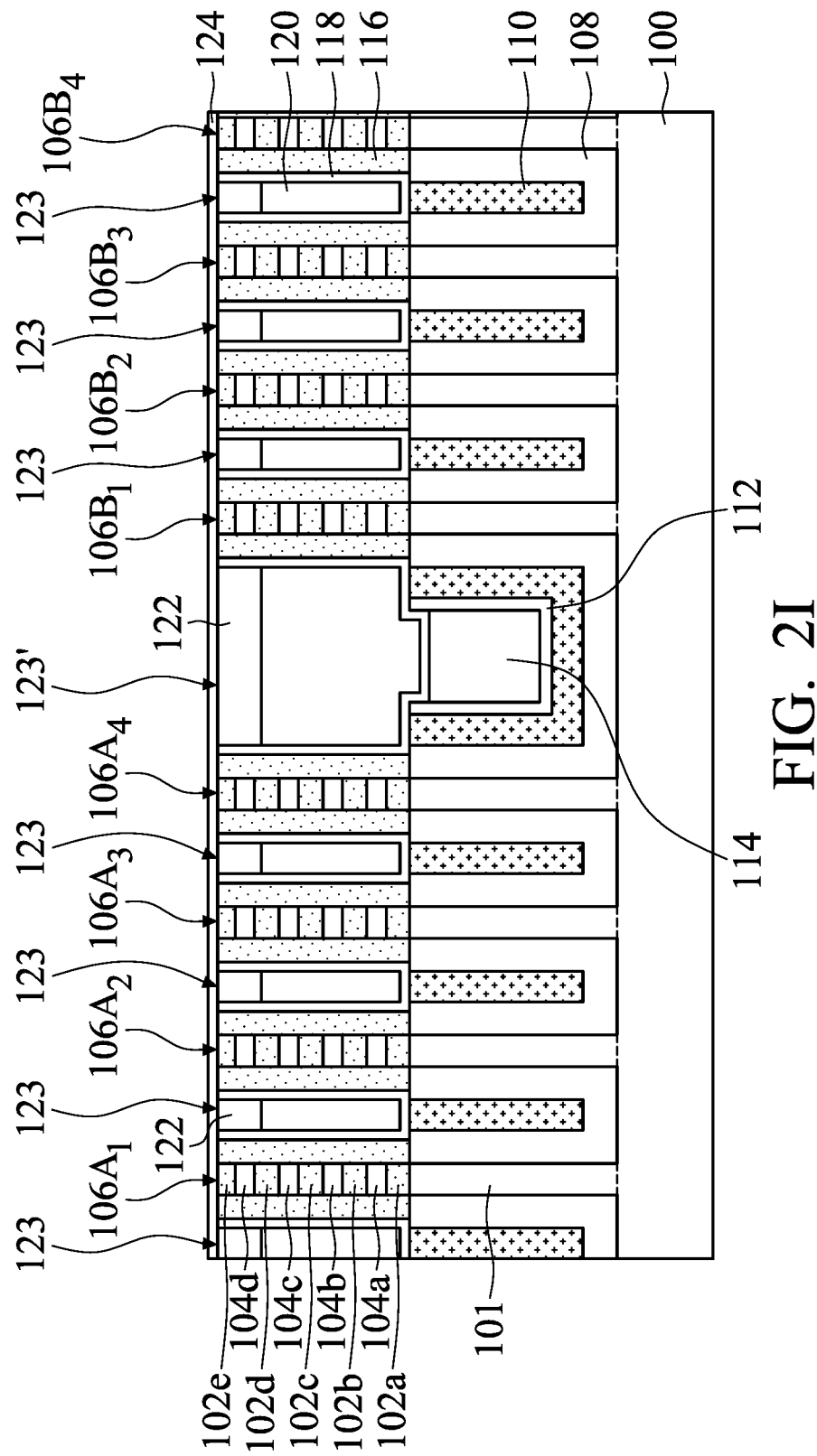

As shown in FIG. 2I, a gate dielectric layer 124 is deposited over the structure shown in FIG. 2H, in accordance with some embodiments. Some portions of the gate dielectric layer 124 will be replaced with a high-k gate dielectric layer during a subsequent gate replacement process. Some portions of the gate dielectric layer 124 will remain without being removed and still function as a gate dielectric layer. The gate dielectric layer 124 may be made of or include silicon oxide. The gate dielectric layer 124 may be deposited using an ALD process, a CVD process, one or more other applicable processes, or a combination thereof.

Figure 2J:
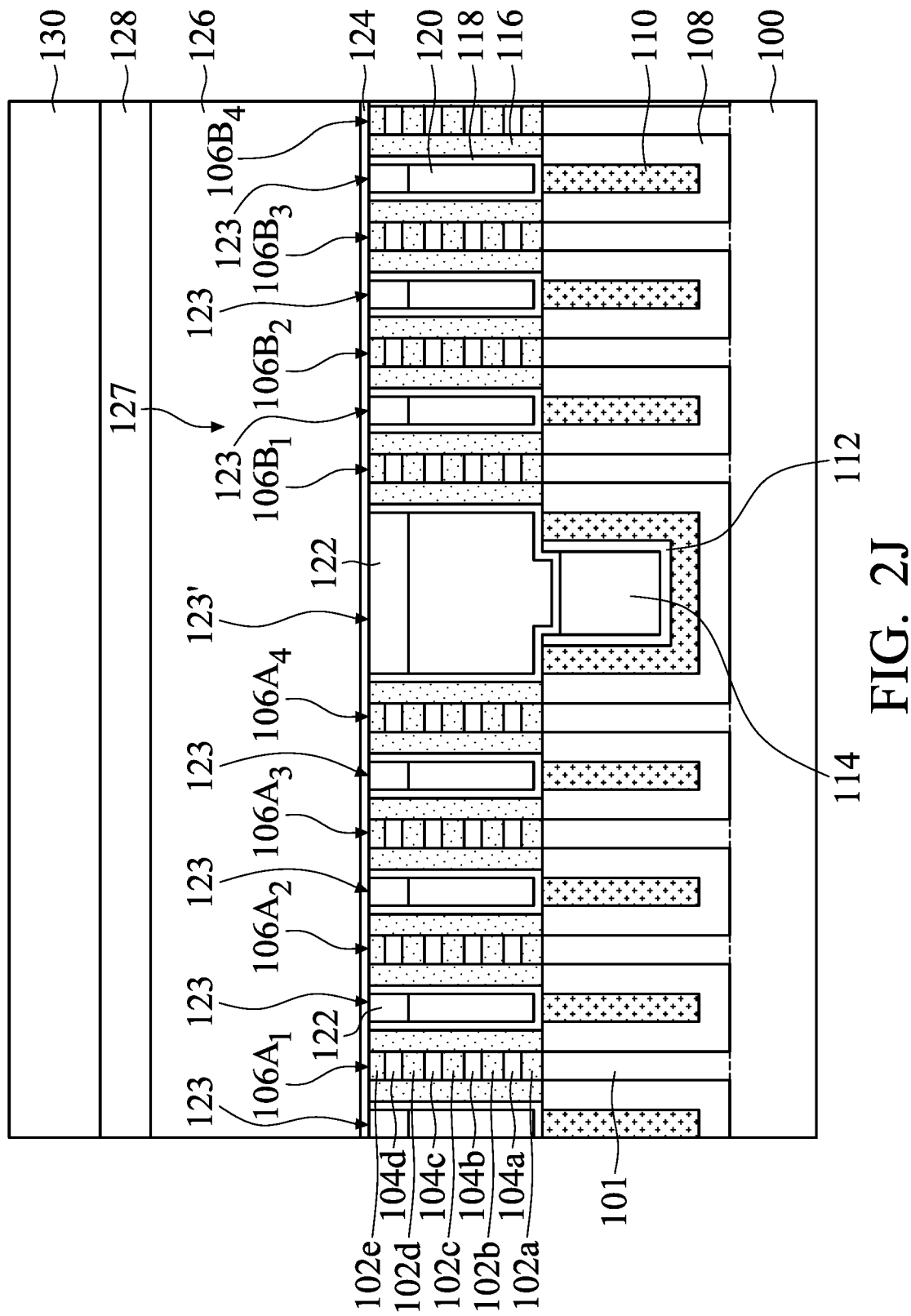

In some embodiments, FIG. 2J is a cross-sectional view of the structure taken along the line 2J-2J in FIG. 1B. As shown in FIGS. 1B and 2J, dummy gate stacks 127 are formed, in accordance with some embodiments. Each of the dummy gate stacks 127 extend across the fin structures $106A_1$-$106A_4$ and $106B_1$-$106B_4$, as shown in FIG. 1B. Each of the dummy gate stacks 127 includes a dummy gate electrode 126 and a portion of the gate dielectric layer 124.

In some embodiments, a patterned hard mask element may be used to assist in the formation of the dummy gate stack 127. The patterned hard mask may include a lower layer 128 and an upper layer 130. The lower layer 128 may be made of silicon oxide, and the upper layer 130 may be made of silicon nitride. Alternatively, the lower layer 128 may be made of silicon nitride, and the upper layer 130 may be made of silicon oxide.

A dummy gate electrode layer may be deposited over the gate dielectric layer 124. Afterwards, with the patterned hard mask element as an etching mask, one or more etching processes are used to partially remove the dummy gate electrode layer and the gate dielectric layer 124. As a result, some remaining portions of the dummy gate electrode layer form the dummy electrodes 126. The dummy gate electrode 126 and the gate dielectric layer 124 thereunder together form the dummy gate stack 127.

Figure 3A:
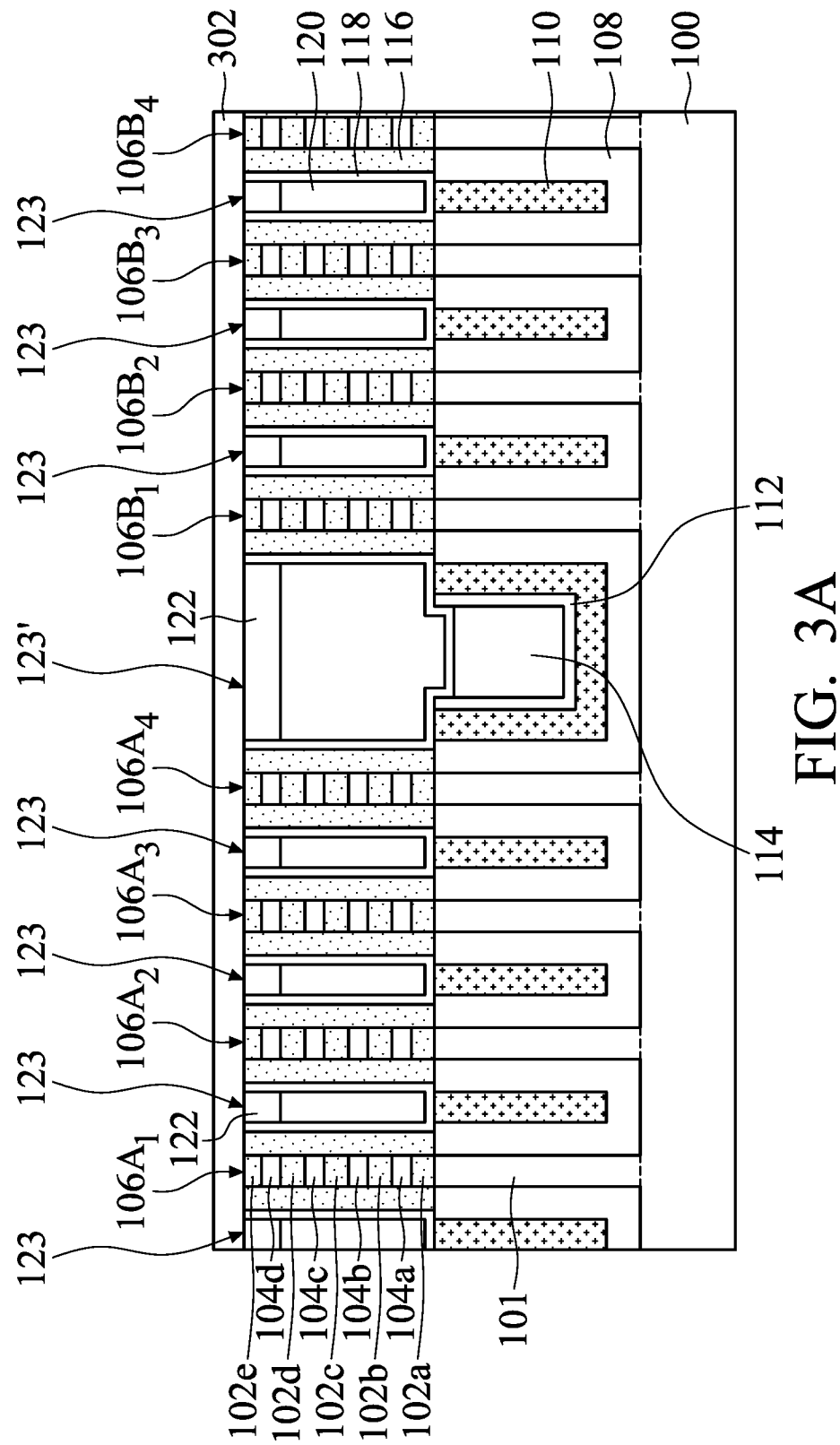
FIGS. 3A-3D are cross-sectional views of various stages of a process for forming a semiconductor device structure, in accordance with some embodiments.

FIGS. 3A-3D are cross-sectional views of various stages of a process for forming a semiconductor device structure, in accordance with some embodiments. FIGS. 3A-3D show the subsequent processes including the formation of spacer elements and epitaxial structures. A spacer layer 302 is deposited over the structure shown in FIGS. 2J and 1B, in accordance with some embodiments. In some embodiments, FIG. 3A shows the cross-sectional of the structure taken along the line parallel to the line 2J-2J in FIG. 1B and passing through the portions of the fin structures $106A_1$-$106A_4$ and $106B_1$-$106B_4$ that are between the dummy gate stacks 127. FIG. 3A shows the cross-sectional view of the region where source/drain structures are designed to be formed.

As shown in FIG. 3A, the spacer layer 302 covers the fin structures $106A_1$-$106A_4$ and $106B_1$-$106B_4$ and the dielectric fins 123 and 123' that are originally exposed without being covered by the dummy gate stacks 127.

Figure 3B:
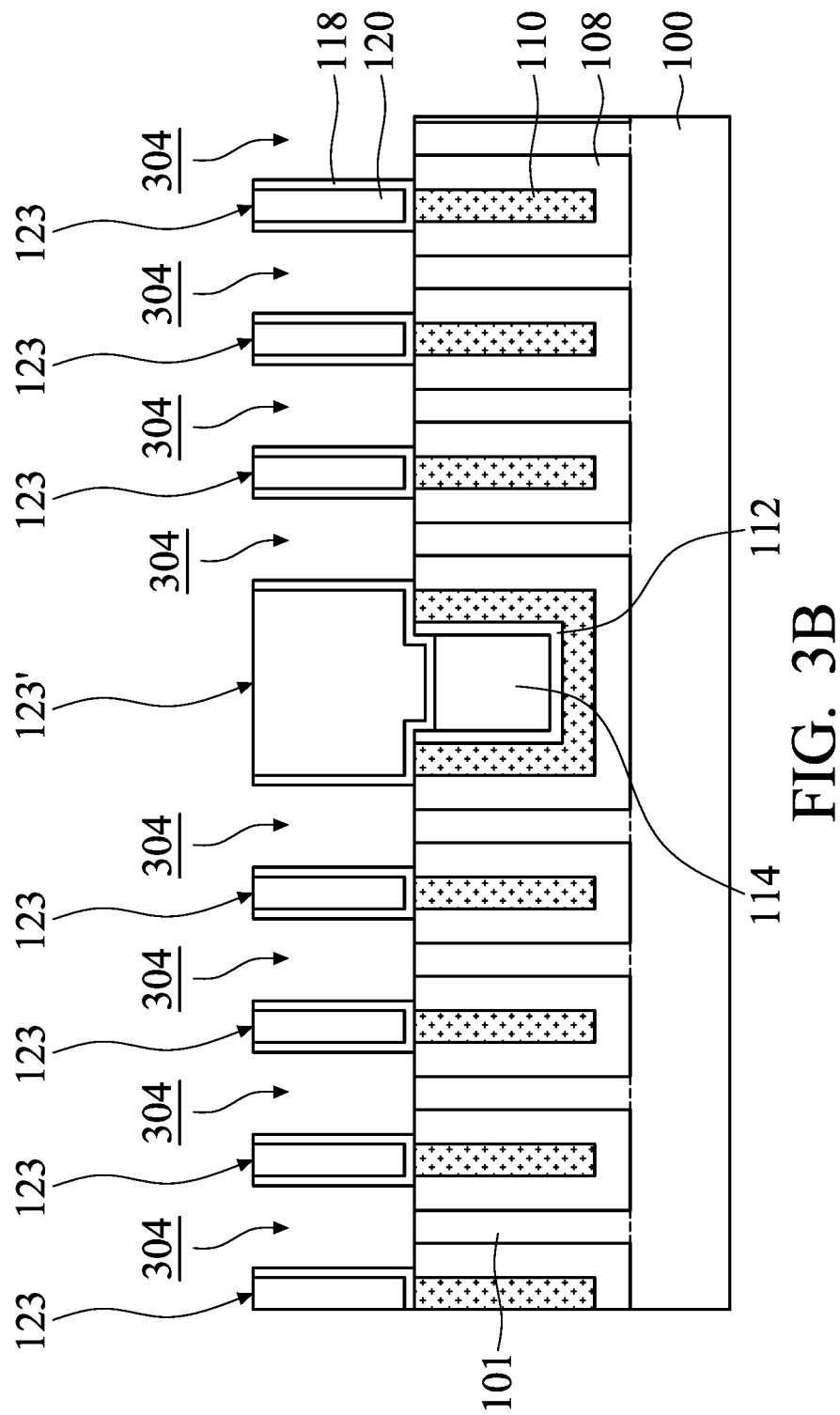

Afterwards, the spacer layer 302 is partially removed, in accordance with some embodiments. One or more anisotropic etching processes may be used to partially remove the spacer layer 302. As a result, remaining portions of the spacer layer 302 form gate sidewall spacers 302' that extend along the sidewalls of the dummy gate stacks 127, as shown in FIG. 1C. In some embodiments, FIG. 3B is a cross-sectional view of the structure taken along the line 3B-3B in FIG. 1C. As shown in FIG. 3B, the portions of the spacer layer 302 over the source/drain regions are removed. As a result, the elements originally under the spacer layer 302 are exposed after the spacer layer 302 is partially removed to form the spacer elements 302' (not shown in FIG. 3B).

In some embodiments, the fin structures $106A_1$-$106A_4$ and $106B_1$-$106B_4$ are partially removed to form recesses 304 that are used to contain epitaxial structures (such as source/drain structures) that will be formed later. One or more etching processes may be used to form the recesses 304. In some embodiments, a dry etching process is used to form the recesses 304. Alternatively, a wet etching process may be used to form the recesses 304. During the one or more etching processes, the dielectric layer 118, that covers the sidewalls of the dielectric layer 120, may prevent the dielectric layer 120 from being etched or damaged.

In some embodiments, the partial removal of the spacer layer 302 and the formation of the recesses 304 are performed using the same etching process. In some embodiments, during the etching process, the portions of the protection structures 123 and 123' that are not covered by the dummy gate stacks 127 or the gate sidewall spacers 302' are also consumed.

Figure 4A:
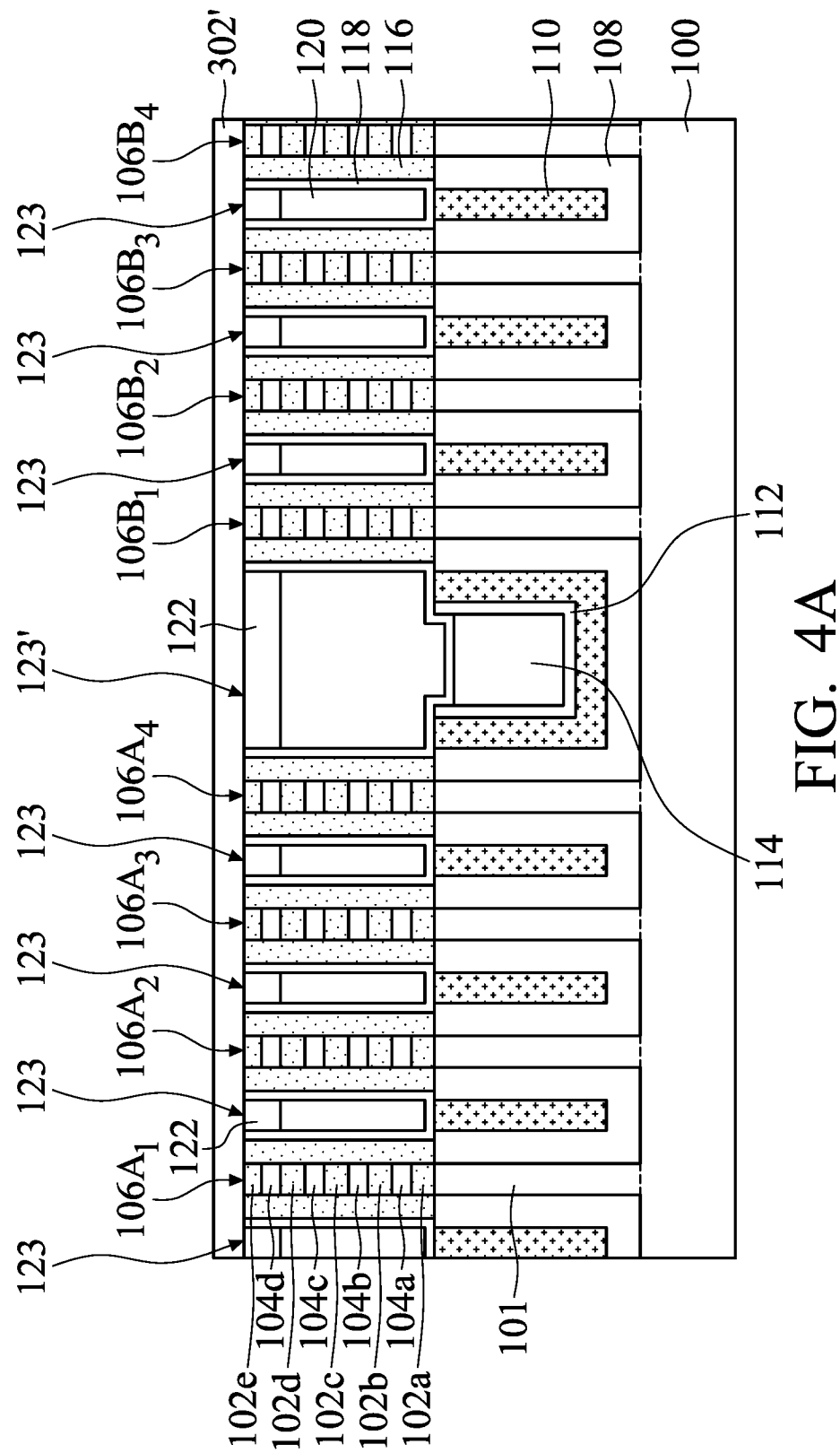
FIGS. 4A-4C are cross-sectional views of various stages of a process for forming a semiconductor device structure, in accordance with some embodiments.
Figure 4B:
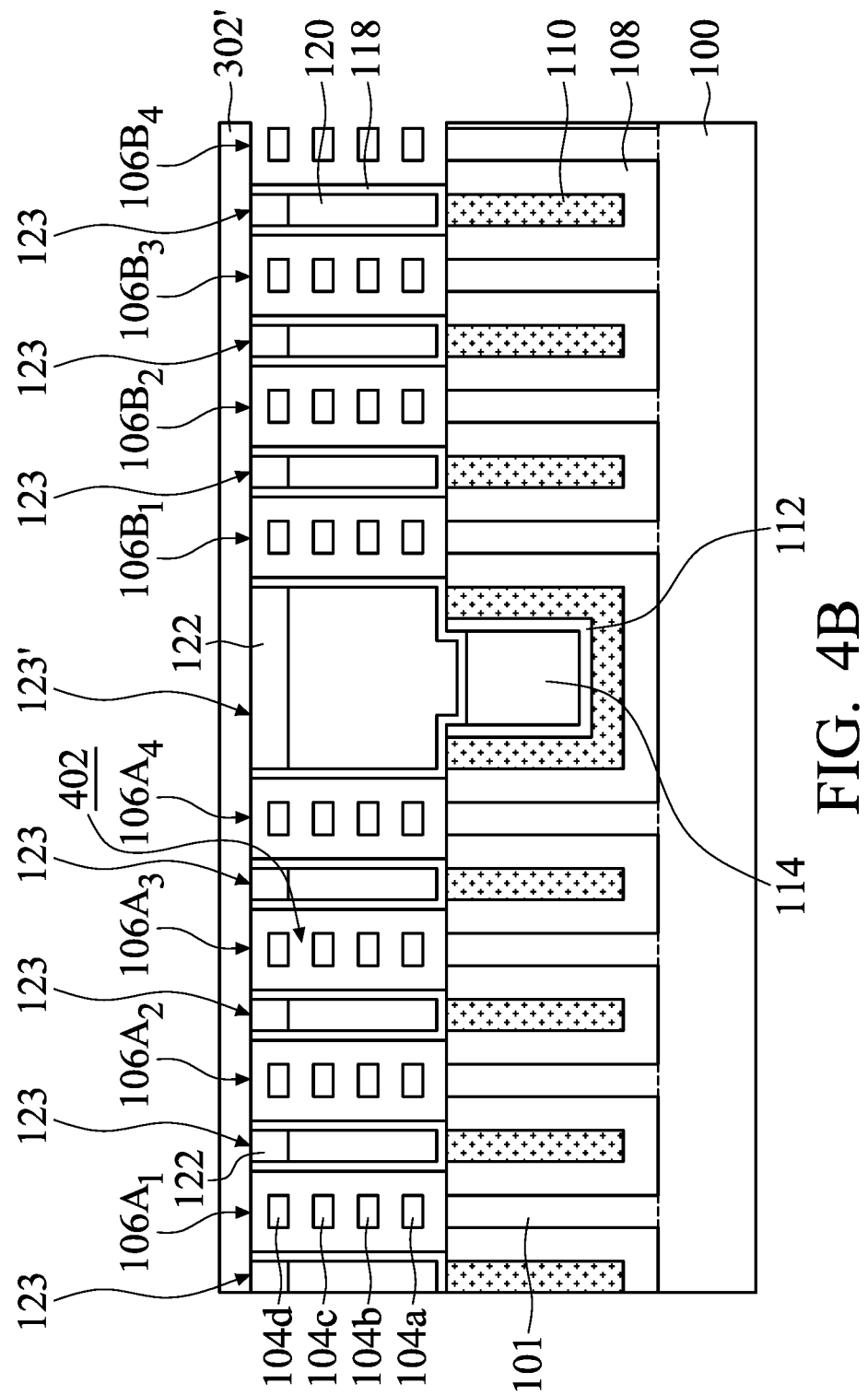
Figure 4C:
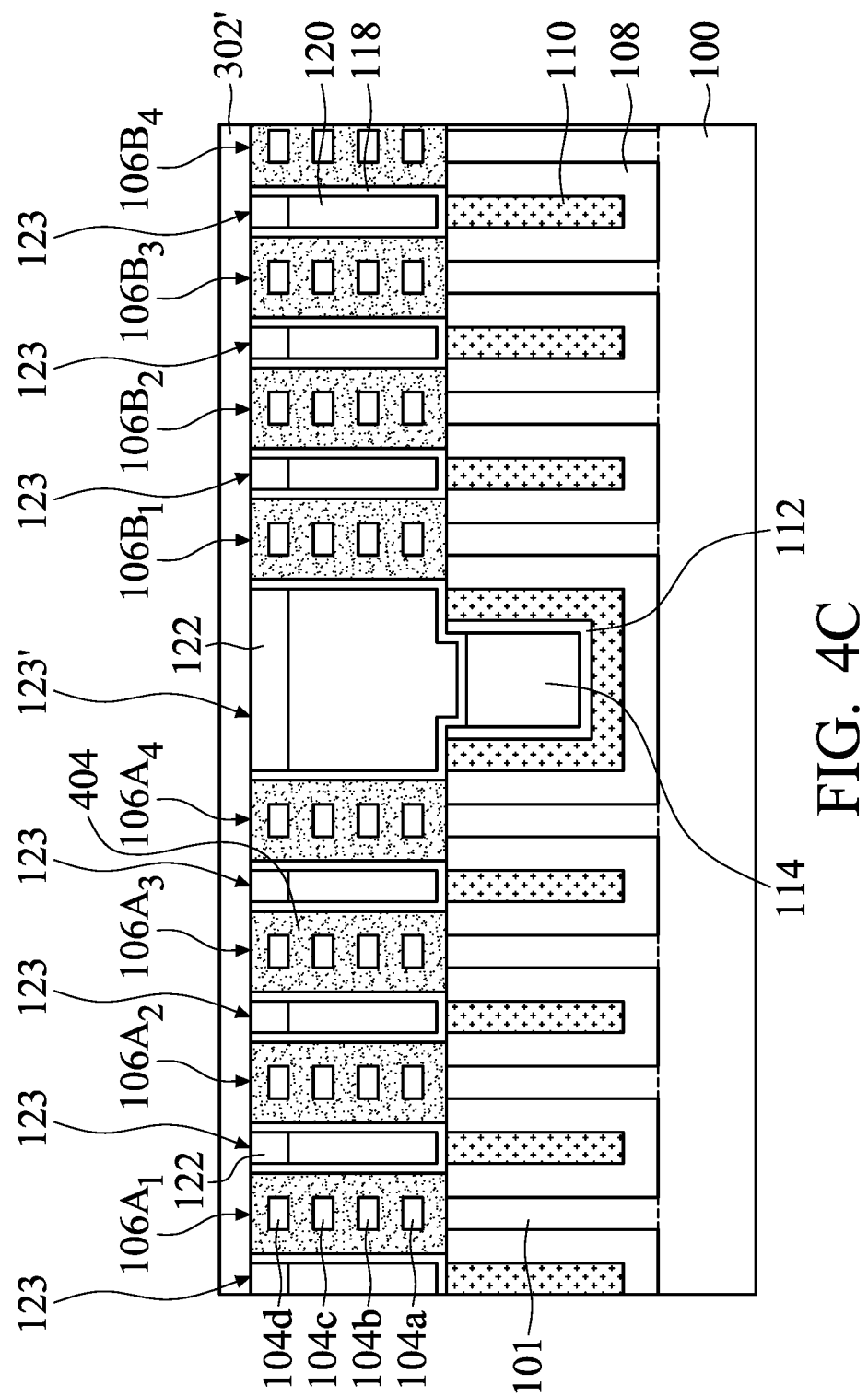

FIGS. 4A-4C are cross-sectional views of a process for forming a semiconductor device structure, in accordance with some embodiments. FIGS. 4A-4C show the subsequent formation of inner spacers. In some embodiments, FIG. 4A is a cross-sectional view of the structure taken along the line 4A-4A in FIG. 1C. After the partial removal of the spacer layer 302, the spacer elements 302' are formed. In FIG. 4A, one of the spacer elements 302' is shown. The spacer element 302' covers portions of the fin structures $106A_1$-$106A_4$ and $106B_1$-$106B_4$ and the dielectric fins 123 and 123'.

As shown in FIG. 4B, the sacrificial layers 102a-102e and the sacrificial material 116 are partially removed such that recesses 402 are formed under the spacer elements 302', in accordance with some embodiments. The recesses 402 surround the edge portions of the semiconductor layers 104a-104d, as shown in FIG. 4B. The recesses 402 are used to contain inner spacers that will be formed later. The sacrificial layers 102a-102e and the sacrificial material 116 may be partially etched using a wet etching process, a dry etching process, or a combination thereof.

As shown in FIG. 4C, inner spacers 404 are formed in the recesses 402, in accordance with some embodiments. The inner spacers 404 wrap around the edge portions of the semiconductor layers 104a-104d. In the subsequent processes, the sacrificial layers 102a-102e and the sacrificial material 116 will be removed to release the semiconductor layers 104a-104d. The remaining portions of the semiconductor layers 104a-104d will form multiple suspended semiconductor nanostructures. These semiconductor nanostructures may function as the channel structures of one or more transistors. The inner spacers 404 would wrap around the edge portions of the semiconductor nanostructures that are constructed or made up of the remaining portions of the semiconductor layers 104a-104d.

In some embodiments, a spacer layer is deposited to fill the recesses 402. The spacer layer may be made of or include carbon-containing silicon nitride (SiCN), carbon-containing silicon oxynitride (SiOCN), carbon-containing silicon oxide (SiOC), one or more other suitable materials, or a combination thereof. The spacer layer may be deposited using a CVD process, an ALD process, one or more other applicable processes, or a combination thereof.

Afterwards, an etching process is used to partially remove the spacer layer, in accordance with some embodiments. The remaining portions of the spacer layer in the recesses 402 form the inner spacers 404, as shown in FIG. 4C. The etching process may include a dry etching process, a wet etching process, or a combination thereof. In some embodiments, the inner spacers 404 are in direct contact with the dielectric fins 123 or 123', as shown in FIG. 4C.

The inner spacers 404 may be used to prevent subsequently formed epitaxial structures (that function as, for example, source/drain structures) from being damaged during a subsequent gate replacement process. As shown in FIGS. 1C and 4C, each of the inner spacers 404 (that is below the gate sidewall spacer 302') is between the to-be-formed epitaxial structures and the to-be-formed metal gate stack. The inner spacers 404 may also be used to reduce parasitic capacitance between the subsequently formed source/drain structures and the gate stacks.

Figure 3C:
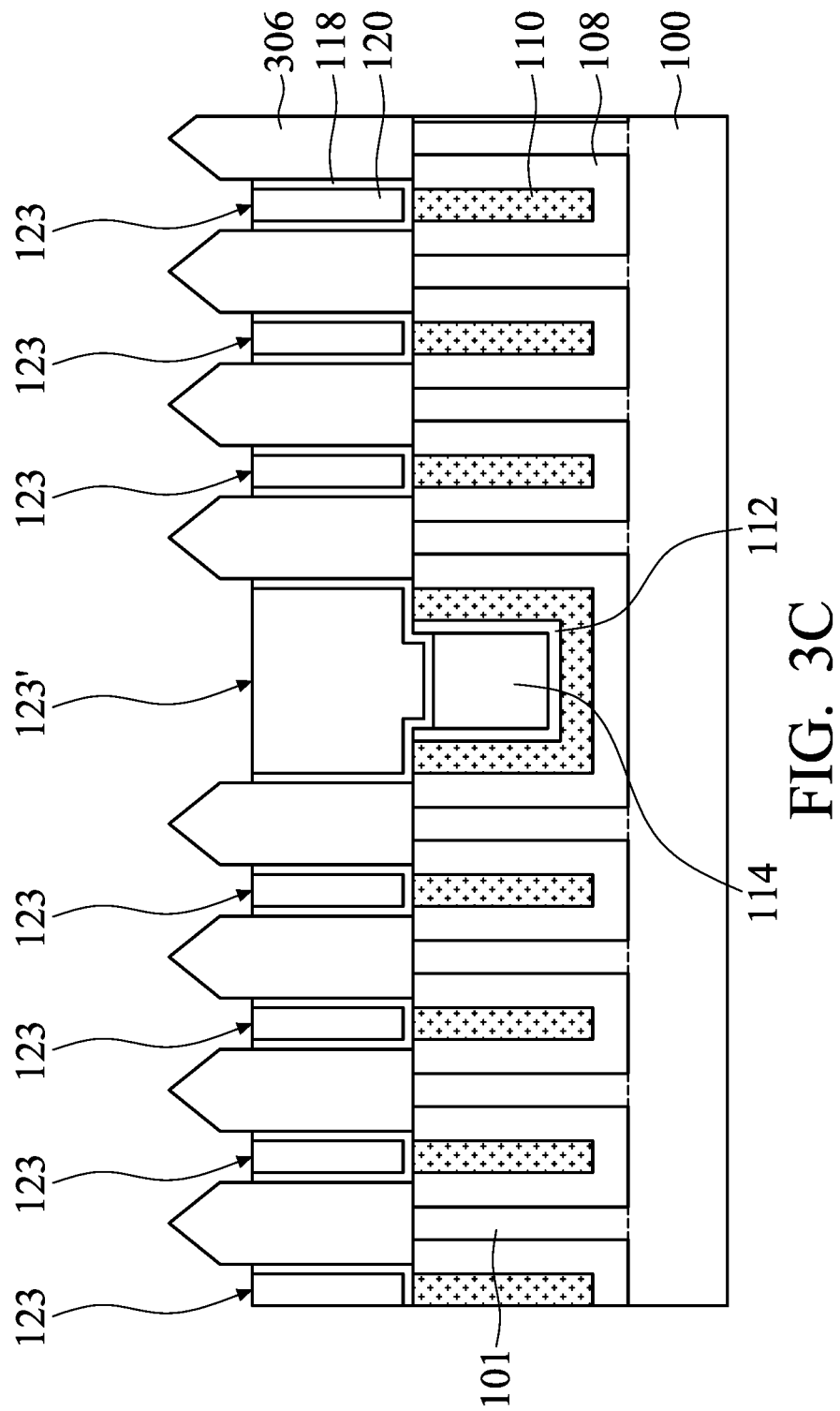

After the formation of the inner spacers 404, epitaxial structures 306 are formed, as shown in FIG. 3C in accordance with some embodiments. In some embodiments, the epitaxial structures 306 fill the recesses 304, as shown in FIG. 3C. In some other embodiments, the epitaxial structures 306 overfill the recesses 304. In some other embodiments, the epitaxial structures 306 partially fill the recesses 304. During the epitaxial growth of the epitaxial structures 306, the dielectric fins 123 may function as blocking structures that prevent the nearby epitaxial structures 306 from being merged together.

In some embodiments, the epitaxial structures 306 function as source/drain structures. In some embodiments, the epitaxial structures 306 are n-type regions. The epitaxial structures 306 may include epitaxially grown silicon, epitaxially grown silicon carbide (SiC), epitaxially grown silicon phosphide (SiP), or another suitable epitaxially grown semiconductor material. In some embodiments, the epitaxial structures 306 are p-type doped regions. The epitaxial structures 306 may include epitaxially grown silicon germanium (SiGe), epitaxially grown silicon, or another suitable epitaxially grown semiconductor material. In some embodiments, some of the epitaxial structures 306 are p-type doped regions, and some of the epitaxial structures 306 are n-type doped regions.

In some embodiments, the epitaxial structures 306 are formed using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, one or more other applicable processes, or a combination thereof.

In some embodiments, the epitaxial structures 306 are doped with one or more suitable dopants. For example, the epitaxial structures 306 are Si source/drain features doped with phosphor (P), antimony (Sb), or another suitable dopant. In some embodiments, the epitaxial structures 138 are doped with one or more suitable dopants. For example, the epitaxial structures 138 are SiGe source/drain features or Si source/drain features that are doped with boron (B), gallium (Ga), indium (In), or another suitable dopant.

In some embodiments, the epitaxial structures 306 are doped in-situ during their epitaxial growth. In some other embodiments, the epitaxial structures 306 are not doped during the growth of the epitaxial structures 306. Instead, after the formation of the epitaxial structures 306, the epitaxial structures 306 are doped in a subsequent process. In some embodiments, the doping is achieved by using an ion implantation process, a plasma immersion ion implantation process, a gas and/or solid source diffusion process, one or more other applicable processes, or a combination thereof. In some embodiments, the epitaxial structures 306 are further exposed to one or more annealing processes to activate the dopants. For example, a rapid thermal annealing process is used.

Figure 3D:
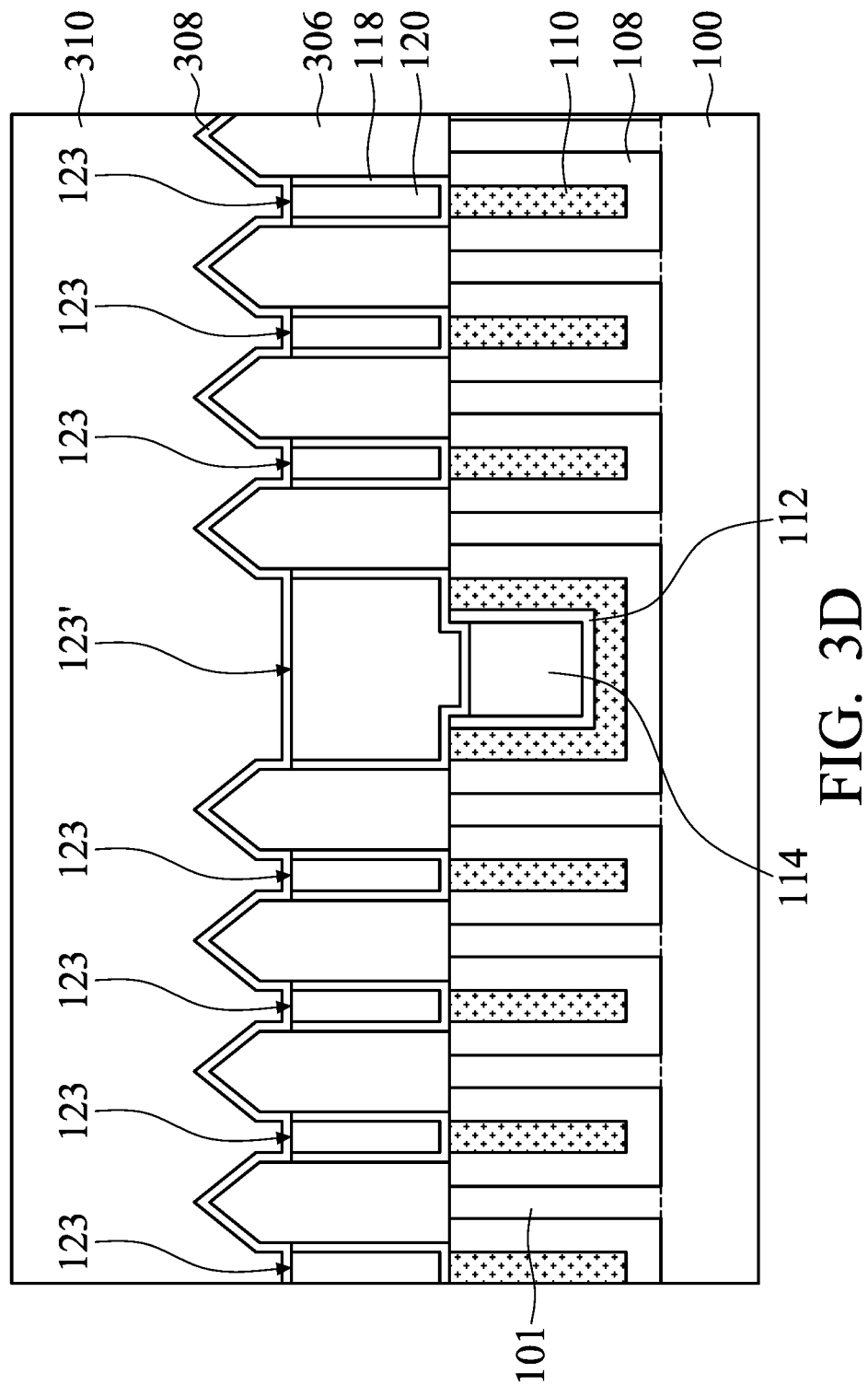

As shown in FIG. 3D, a contact etch stop layer 308 and a dielectric layer 310 are formed to cover the epitaxial structures 306, in accordance with some embodiments. The contact etch stop layer 308 and the dielectric layer 310 also surround the dummy gate stacks 127. The dielectric fins 123 and 123' may help to reduce the electrical breakdown risk between nearby epitaxial structures 306 or nearby conductive contact that electrically connected to nearby epitaxial structures 306. The reliability and performance of the semiconductor device structure are improved.

The contact etch stop layer 308 may be made of or include silicon nitride, silicon oxynitride, silicon carbide, aluminum oxide, one or more other suitable materials, or a combination thereof. The dielectric layer 310 may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof.

In some embodiments, an etch stop material layer and a dielectric material layer are sequentially deposited over the structure shown in FIG. 3C. The etch stop material layer may be deposited using a CVD process, an ALD process, a PVD process, one or more other applicable processes, or a combination thereof. The dielectric material layer may be deposited using an FCVD process, a CVD process, an ALD process, one or more other applicable processes, or a combination thereof.

Afterwards, a planarization process is used to partially remove the etch stop material layer and the dielectric material layer. As a result, the remaining portions of the etch stop material layer and the dielectric material layer respectively form the contact etch stop layer 308 and the dielectric layer 310, as shown in FIG. 3D. The planarization process may include a CMP process, a grinding process, an etching process, a dry polishing process, one or more other applicable processes, or a combination thereof.

Figure 2K:
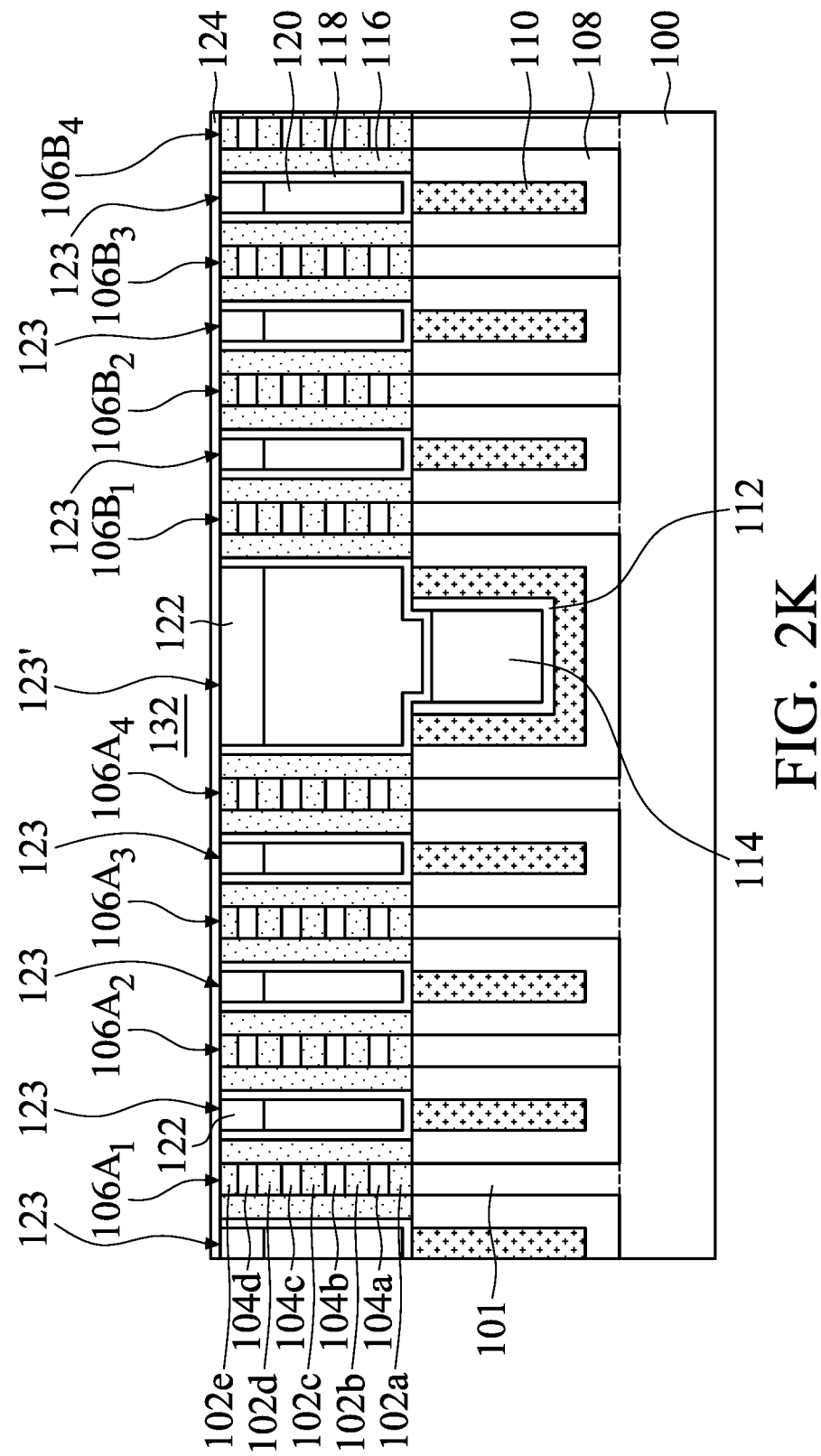

Afterwards, referring back to FIG. 2K which shows the "cut gate" cross-sectional view, the dummy gate electrode 126 are removed, in accordance with some embodiments. In some embodiments, one or more etching processes are used to remove the dummy gate electrodes 126. As a result, trenches 132 are formed. FIG. 2K shows one of the trenches 132. As shown in FIG. 2K, the trench 132 exposes the gate dielectric layer 124.

Figure 2L:
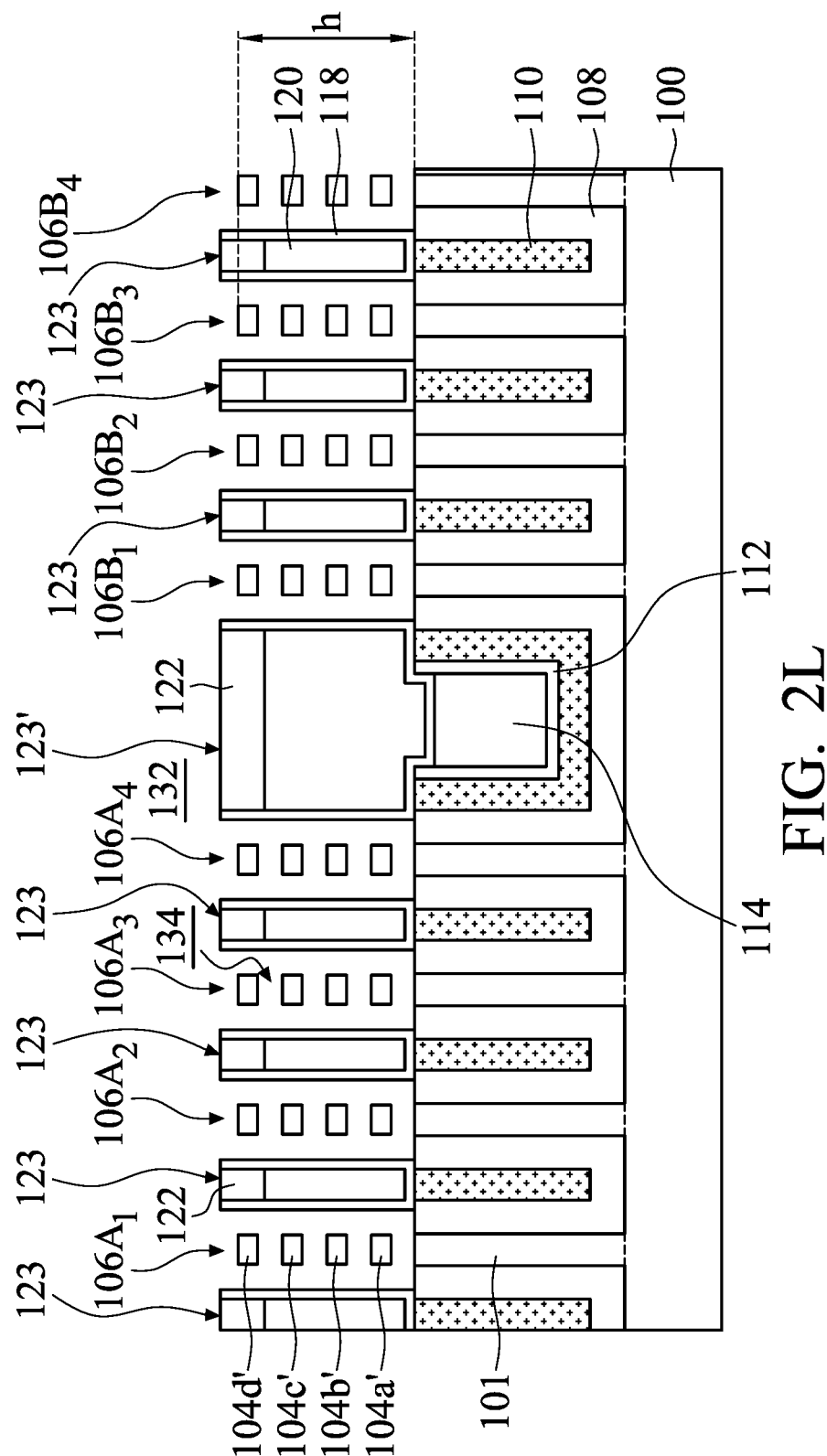

As shown in FIG. 2L, the gate dielectric layer 124 exposed by the trench 132 is removed, in accordance with some embodiments. Afterwards, the sacrificial layers 102a-102e and the sacrificial material 116 are removed to form recesses 134, as shown in FIG. 2L in accordance with some embodiments. In some embodiments, an etching process is used to remove the sacrificial layers 102a-102e and the sacrificial material 116. In some embodiments, the sacrificial layers 102a-102e, the sacrificial material 116, and the gate dielectric layer 124 are etched using the same etching process.

Due to high etching selectivity, the semiconductor layers 104a-104d are substantially not (or slightly) etched. The remaining portions of the semiconductor layers 104a-104d form multiple semiconductor nanostructures 104a'-104d', as shown in FIG. 2L. The semiconductor nanostructures 104a'-104d' may function as the channel structures of one or more transistors. The semiconductor nanostructures 104a'-104d' may be semiconductor nanosheets, semiconductor nanowires, semiconductor nanostripes, other semiconductor structures with suitable shapes, or a combination thereof. As shown in FIG. 2L, each of the semiconductor nanostructures 104a'-104d' of the fin structures has a total height h. The total height h may be in a range from about 30 nm to about 80 nm.

During the removal of the sacrificial layers 102a-102d, the previously formed inner spacers 404 (as illustrated in FIG. 4C), that wrap around the edge portions of the semiconductor nanostructures 104a'-104d', protect the epitaxial structures 306 adjacent to the semiconductor nanostructures 104a'-104d' from being etched or damaged. The quality and reliability of the semiconductor device structure are ensured.

Figure 2M:
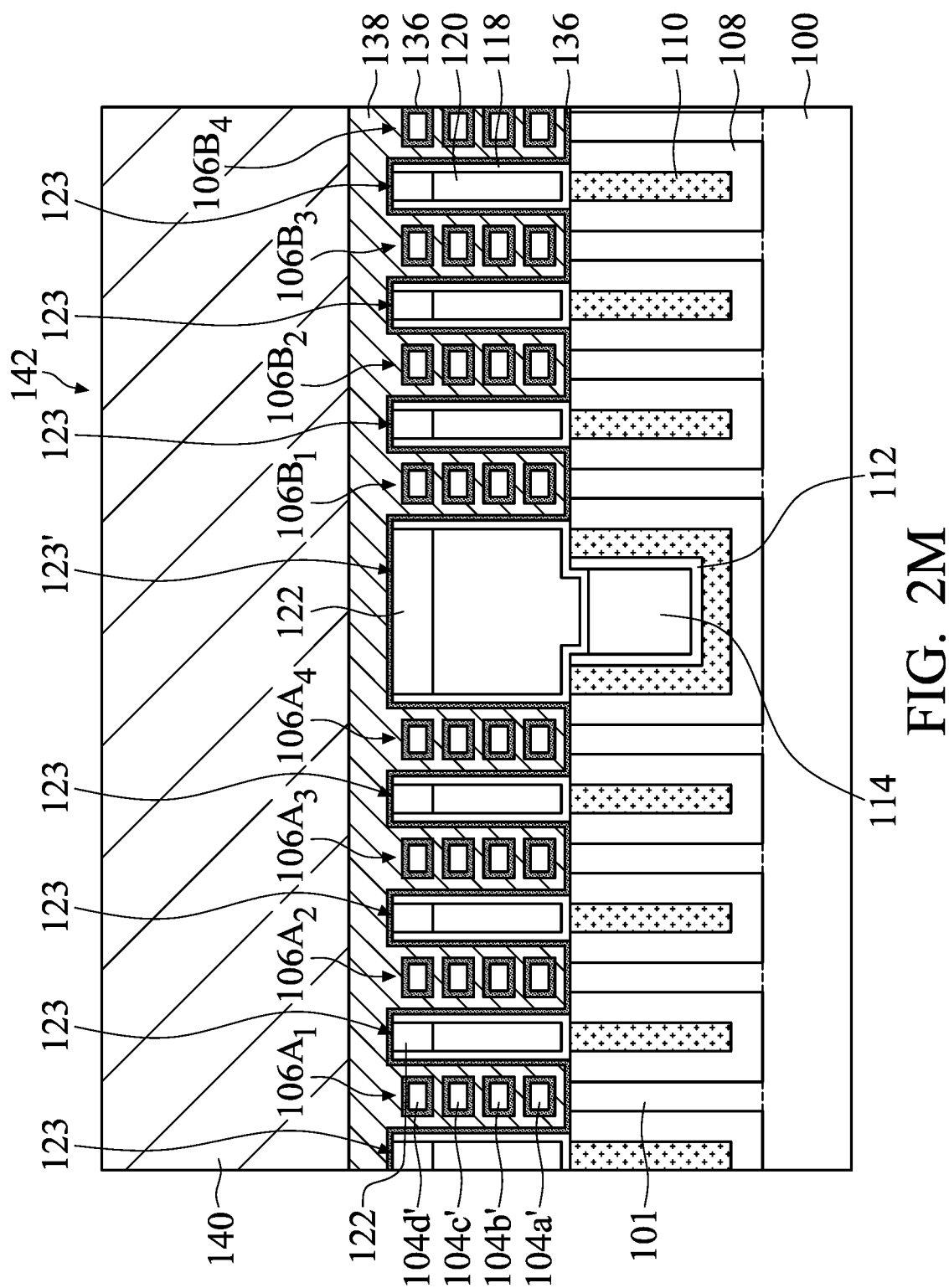

Afterwards, metal gate stacks 142 are formed to fill the trenches 132, in accordance with some embodiments. In FIG. 2M, one of the metal gate stacks 142 is shown. In some embodiments, the metal gate stack 142 further extends into the recesses 134 to wrap around each of the semiconductor nanostructures 104a'-104d'.

Each of the metal gate stacks 142 includes multiple metal gate stack layers. Each of the metal gate stacks 142 may include a gate dielectric layer 136, a work function layer 138, and a conductive filling 140. In some embodiments, the formation of the metal gate stacks 142 involves the deposition of multiple metal gate stack layers over the dielectric layer 310 (shown in FIG. 3D but not shown in FIG. 2M) to fill the trenches 132. The metal gate stack layers further extend into the recesses 134 to wrap around each of the semiconductor nanostructures 104a'-104d'.

In some embodiments, the gate dielectric layer 136 is made of or includes a dielectric material with high dielectric constant (high-K). The gate dielectric layer 136 may be made of or include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, one or more other suitable high-K materials, or a combination thereof. The gate dielectric layer 136 may be deposited using an ALD process, a CVD process, one or more other applicable processes, or a combination thereof.

In some embodiments, before the formation of the gate dielectric layer 136, an interfacial layers are formed on the surfaces of the semiconductor nanostructures 104a'-104d'. The interfacial layers are very thin and are made of, for example, silicon oxide or germanium oxide. In some embodiments, the interfacial layers are formed by applying an oxidizing agent on the surfaces of the semiconductor nanostructures 104a'-104d'. For example, a hydrogen peroxide-containing liquid may be applied or provided on the surfaces of the semiconductor nanostructures 104b'-104d' so as to form the interfacial layers.

The work function layer 138 may be used to provide the desired work function for transistors to enhance device performance including improved threshold voltage. In some embodiments, the work function layer 138 is used for forming an NMOS device. The work function layer 138 is an n-type work function layer. The n-type work function layer is capable of providing a work function value suitable for the device, such as equal to or less than about 4.5 eV.

The n-type work function layer may include metal, metal carbide, metal nitride, or a combination thereof. For example, the n-type work function layer includes titanium nitride, tantalum, tantalum nitride, one or more other suitable materials, or a combination thereof. In some embodiments, the n-type work function is an aluminum-containing layer. The aluminum-containing layer may be made of or include TiAlC, TiAlO, TiAlN, one or more other suitable materials, or a combination thereof.

In some other embodiments, the work function layer 152 is used for forming a PMOS device. The work function layer 152 is a p-type work function layer. The p-type work function layer is capable of providing a work function value suitable for the device, such as equal to or greater than about 4.8 eV.

The p-type work function layer may include metal, metal carbide, metal nitride, other suitable materials, or a combination thereof. For example, the p-type metal includes tantalum nitride, tungsten nitride, titanium, titanium nitride, one or more other suitable materials, or a combination thereof.

In some embodiments, the work function layer 138 includes multiple portions. A first portion of the work function layer 138 that wraps around a first group of the fin structures is an n-type work function layer. A second portion of the work function layer 138 that wraps around a second group of the fin structures is a p-type work function layer.

The work function layer 138 may also be made of or include hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combinations thereof. The thickness and/or the compositions of the work function layer 138 may be finetuned to adjust the work function level.

The work function layer 138 may be deposited over the gate dielectric layer 136 using an ALD process, a CVD process, a PVD process, an electroplating process, an electroless plating process, one or more other applicable processes, or a combination thereof.

In some embodiments, a barrier layer is formed before the work function layer 138 to interface the gate dielectric layer 136 with the subsequently formed work function layer 138. The barrier layer may also be used to prevent diffusion between the gate dielectric layer 136 and the subsequently formed work function layer 138. The barrier layer may be made of or include a metal-containing material. The metal-containing material may include titanium nitride, tantalum nitride, one or more other suitable materials, or a combination thereof. The barrier layer may be deposited using an ALD process, a CVD process, a PVD process, an electroplating process, an electroless plating process, one or more other applicable processes, or a combination thereof.

In some embodiments, the conductive filling 140 are made of or include a metal material. The metal material may include tungsten, aluminum, copper, cobalt, one or more other suitable materials, or a combination thereof. A conductive layer used for forming the conductive filling 140 may be deposited over the work function layer 138 using a CVD process, an ALD process, a PVD process, an electroplating process, an electroless plating process, a spin coating process, one or more other applicable processes, or a combination thereof.

In some embodiments, a blocking layer is formed over the work function layer 138 before the formation of the conductive layer used for forming the conductive filling 140. The blocking layer may be used to prevent the subsequently formed conductive layer from diffusing or penetrating into the work function layer 138. The blocking layer may be made of or include tantalum nitride, titanium nitride, one or more other suitable materials, or a combination thereof. The blocking layer may be deposited using an ALD process, a PVD process, an electroplating process, an electroless plating process, one or more other applicable processes, or a combination thereof.

Afterwards, a planarization process is performed to remove the portions of the metal gate stack layers outside of the trenches 132, in accordance with some embodiments. As a result, the remaining portions of the metal gate stack layers form the metal gate stacks 142, as shown in FIG. 2M. In some embodiments, the conductive filling 140 does not extend into the recesses 134 since the recesses 134 are small and have been filled with other elements such as the gate dielectric layer 136 and the work function layer 138. However, embodiments of the disclosure are not limited thereto. In some other embodiments, a portion of the conductive filling 140 extends into the recesses 134, especially for the lower recesses 134 that may have larger space.

Figure 2N:
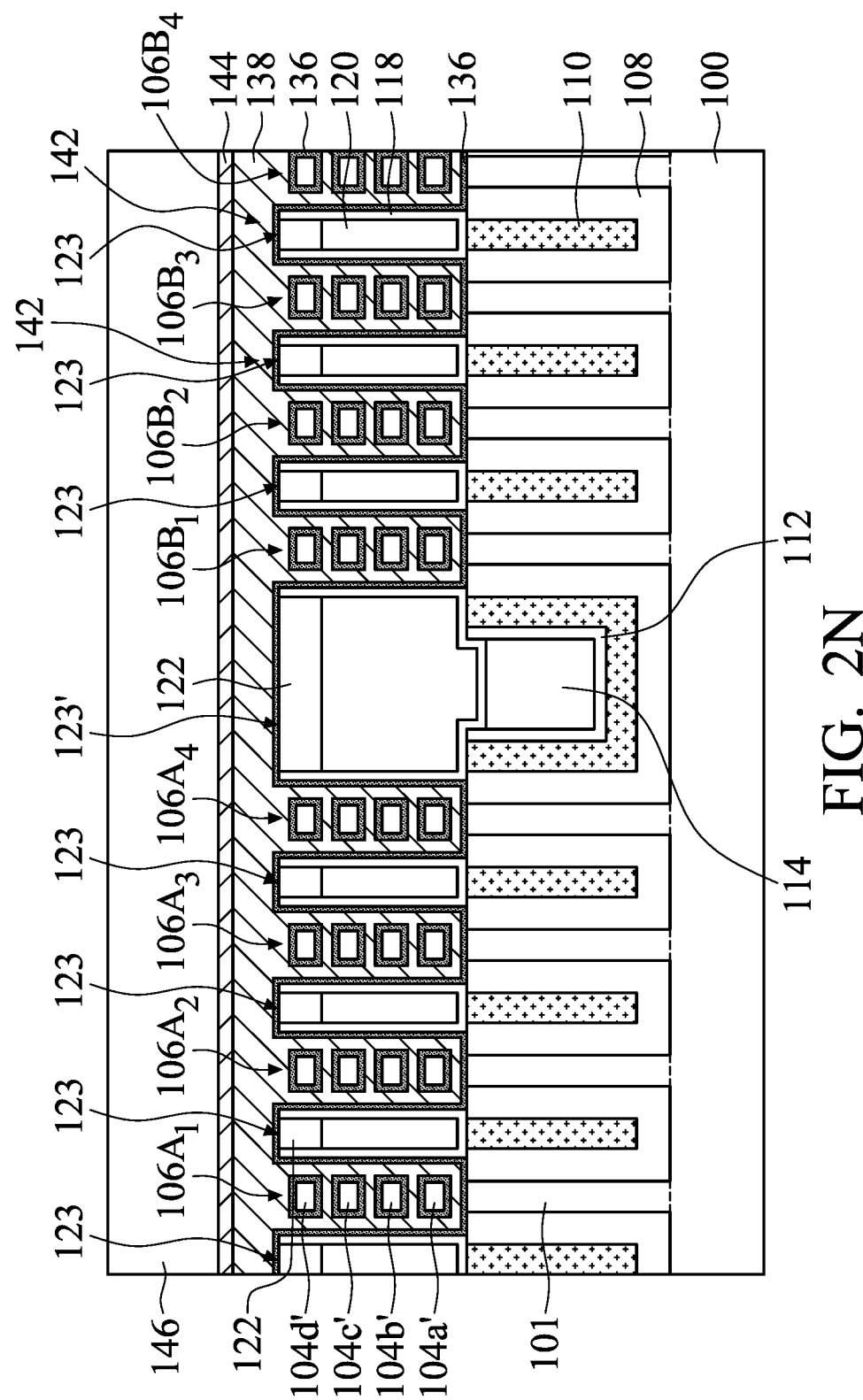

As shown in FIG. 2N, the upper portion of the metal gate stack 142 is removed, in accordance with some embodiments. One or more etching processes may be used to etch back the metal gate stack 142. In some embodiments, the conductive filling 140 is completely removed during the etching back of the metal gate stack 142. In some other embodiments, a portion of the conductive filling 140 still remain after the etching back of the metal gate stack 142.

Afterwards, a conductive layer 144 is formed over the metal gate stack 142 after the etching back of the metal gate stack 142, as shown in FIG. 2N in accordance with some embodiments. The conductive layer 144 may be made of or include tungsten. In some embodiments, the conductive layer 144 is made of or includes tungsten that is substantially free of fluorine. The conductive layer 144 may be formed using a CVD process, an ALD process, a PVD process, an electroplating process, an electroless plating process, one or more other applicable processes, or a combination thereof.

However, embodiments of the disclosure are not limited thereto. Many variations and/or modifications can be made to embodiments of the disclosure. In some other embodiments, the conductive layer 144 is not formed.

Afterwards, a sacrificial film 146 is formed over the conductive layer 144, as shown in FIG. 2N in accordance with some embodiments. The sacrificial film 146 may be made of or include silicon, silicon oxide, silicon carbide, germanium, germanium oxide, one or more other suitable materials, or a combination thereof. The sacrificial film 146 may be formed using a CVD process, an ALD process, one or more other applicable processes, or a combination thereof.

Figure 2O:
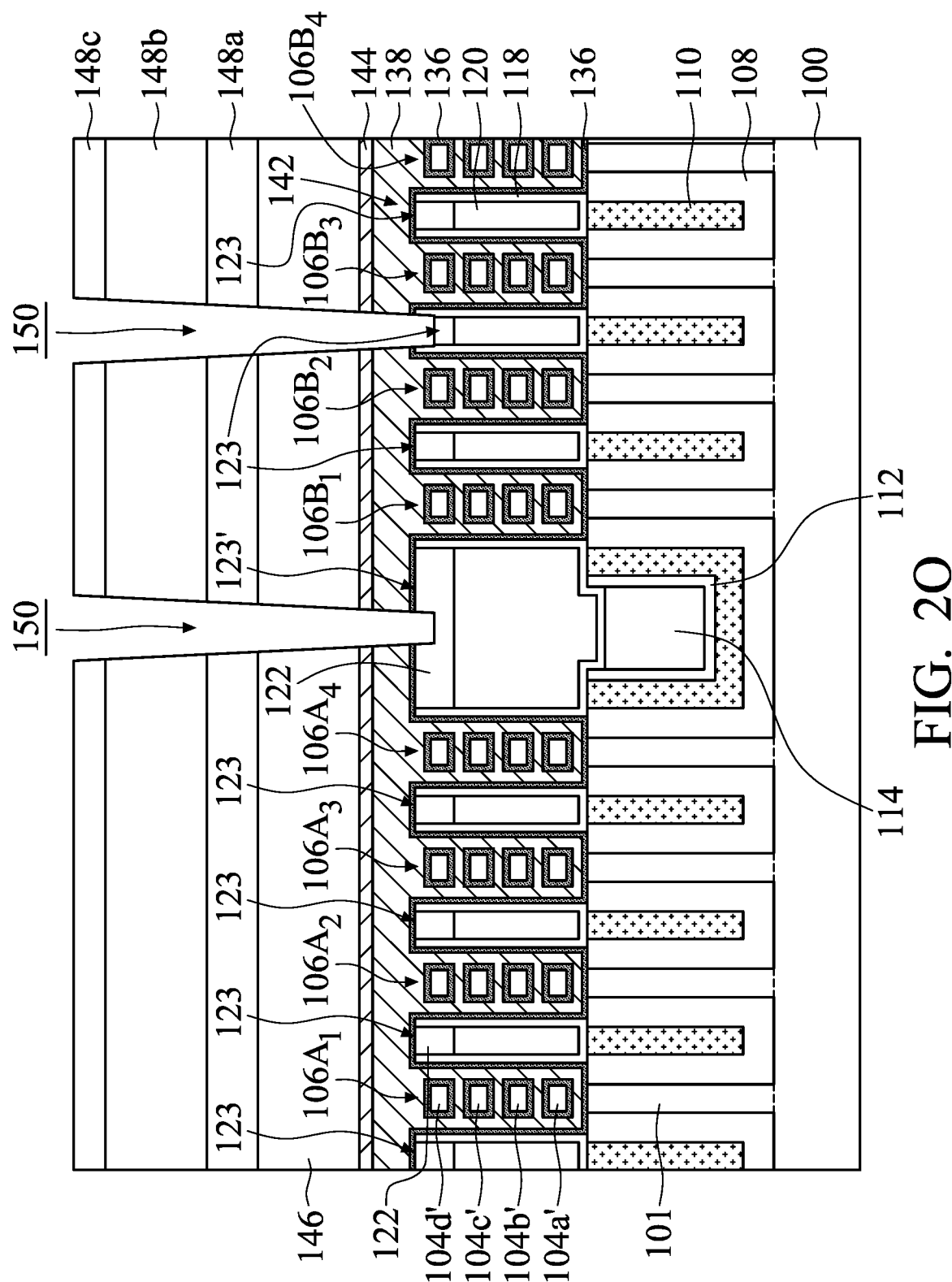

As shown in FIG. 2O, the sacrificial film 146 and the metal gate stack 142 are partially removed to form openings 150, in accordance with some embodiments. The openings expose the dielectric fin 123' and one of the dielectric fin 123. In some embodiments, the openings 150 further extend into the upper portions (i.e., the protection structures 122) of the dielectric fins 123' and 123.

In some embodiments, mask elements 148a, 148b, and 148c are formed over the sacrificial film 146 to assist in the formation of the openings 150, as shown in FIG. 2O. Therefore, each of the openings 150 is ensured to be substantially aligned with the corresponding dielectric fin 123 or 123' thereunder. The mask element 148a may be made of or include silicon nitride, silicon oxynitride, one or more other suitable materials, or a combination thereof. The mask elements 148b and 148c may include one or more photoresist layers and one or more anti-reflection layers.

Figure 2P:
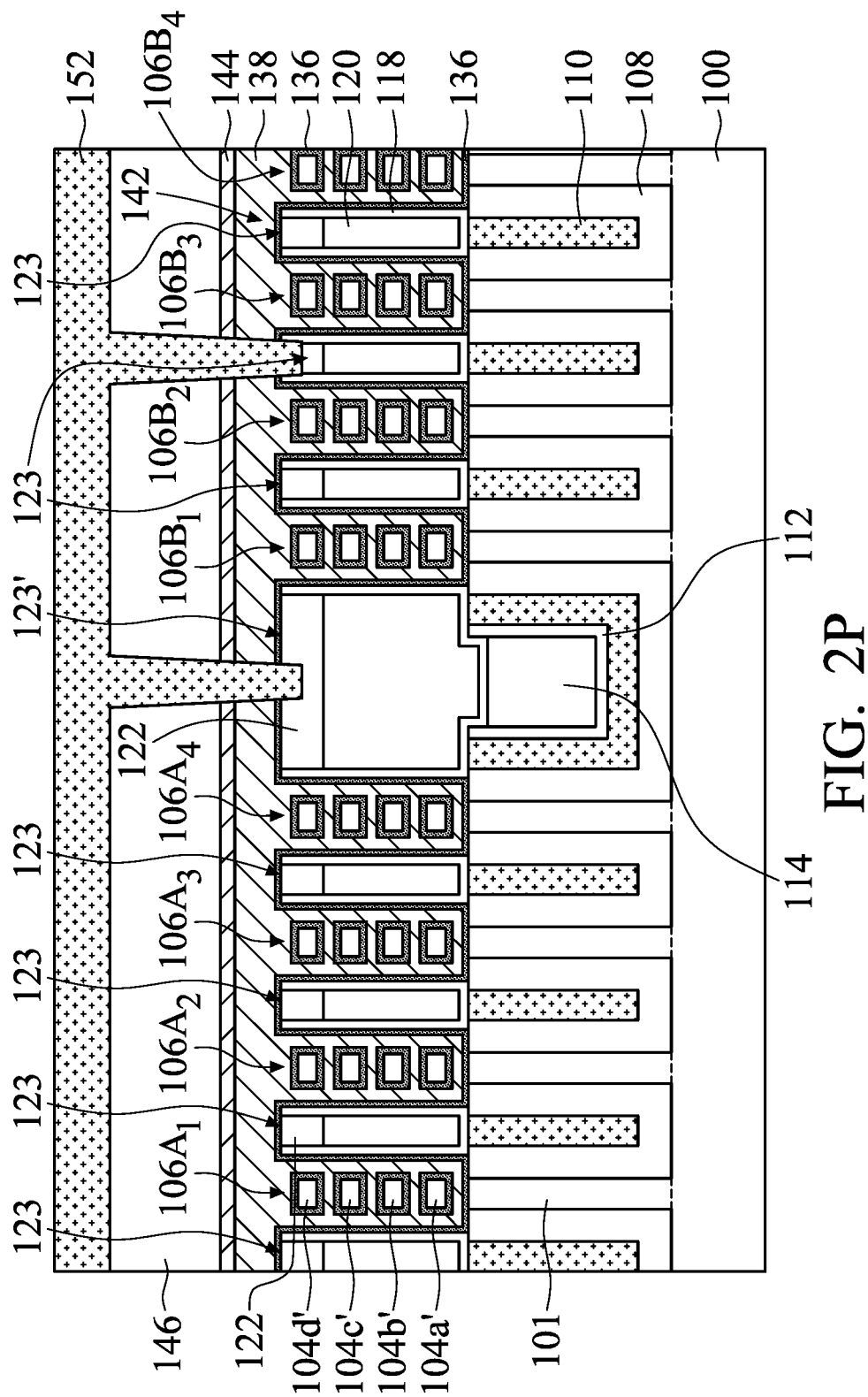

As shown in FIG. 2P, the mask elements 148a, 148b, and 148c are removed after the formation of the openings 150, in accordance with some embodiments. Afterwards, an insulating layer 152 is deposited over the sacrificial film 146 to overfill the openings 150, as shown in FIG. 2P in accordance with some embodiments.

In some embodiments, the insulating layer 152 is made of or includes a dielectric material that has a dielectric constant lower than about 7. The insulating layer 152 may be made of or include silicon oxide, silicon nitride, carbon-containing silicon nitride, silicon oxycarbide, carbon-containing silicon oxynitride, one or more other suitable materials, or a combination thereof. In some other embodiments, the insulating layer 152 is made of or includes a dielectric material that has a dielectric constant greater than about 7. The insulating layer 152 may be made of or include hafnium oxide, zirconium oxide, aluminum hafnium oxide, aluminum oxide, hafnium silicon oxide, one or more other suitable materials, or a combination thereof. In some other embodiments, the insulating layer 152 is made of or includes silicon oxide, silicon nitride, carbon-containing silicon nitride, silicon oxycarbide, carbon-containing silicon oxynitride, hafnium oxide, zirconium oxide, aluminum hafnium oxide, aluminum oxide, hafnium silicon oxide, one or more other suitable materials, or a combination thereof. The insulating layer 152 may be deposited using a CVD process, an ALD process, an FCVD process, one or more other applicable processes, or a combination thereof.

Figure 2Q:
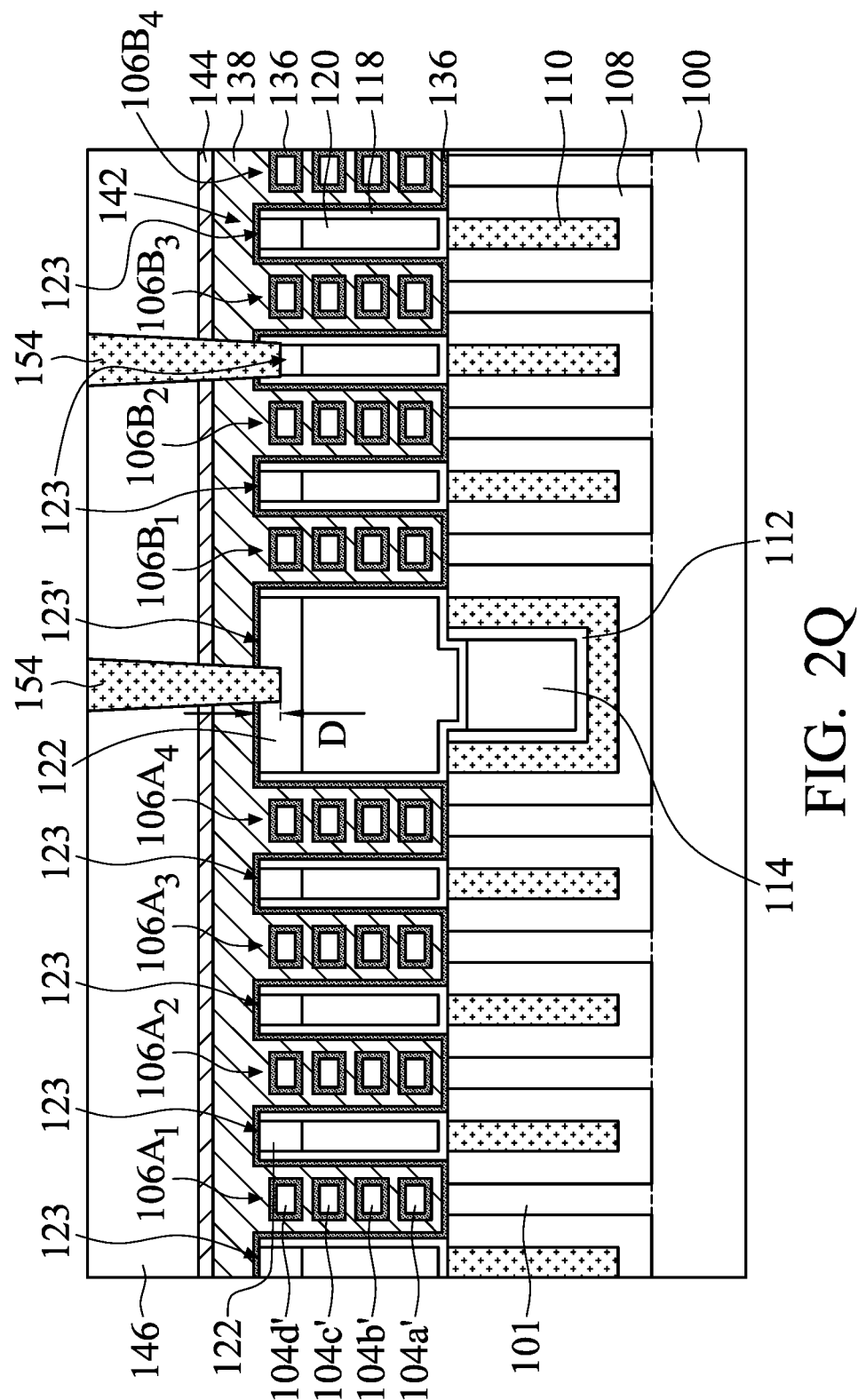

As shown in FIG. 2Q, a planarization process is used to remove the portion of the insulating layer 152 outside of the openings 150, in accordance with some embodiments. As a result, the remaining portions of the insulating layer 152 that fill the openings 150 form insulating structures 154. The planarization process may include a CMP process, a grinding process, a dry polishing process, an etching process, one or more other applicable processes, or a combination thereof.

In some embodiments, each of the insulating structures 154 extends into the protection structure 122 (i.e., the upper portion of the dielectric fin 123 or 123') to an extending depth D, as shown in FIG. 2Q. In some embodiments, the extending depth D of each of the insulating structures 154 is in a range from about 1 nm to about 25 nm.

However, embodiments of the disclosure are not limited thereto. In some other embodiments, the openings 150 do not extend into the protection structure 122. As a result, the insulating structures 154 also do not extend into the protection structure 122. In these cases, the extending depth D is substantially equal to zero.

Figure 2R:
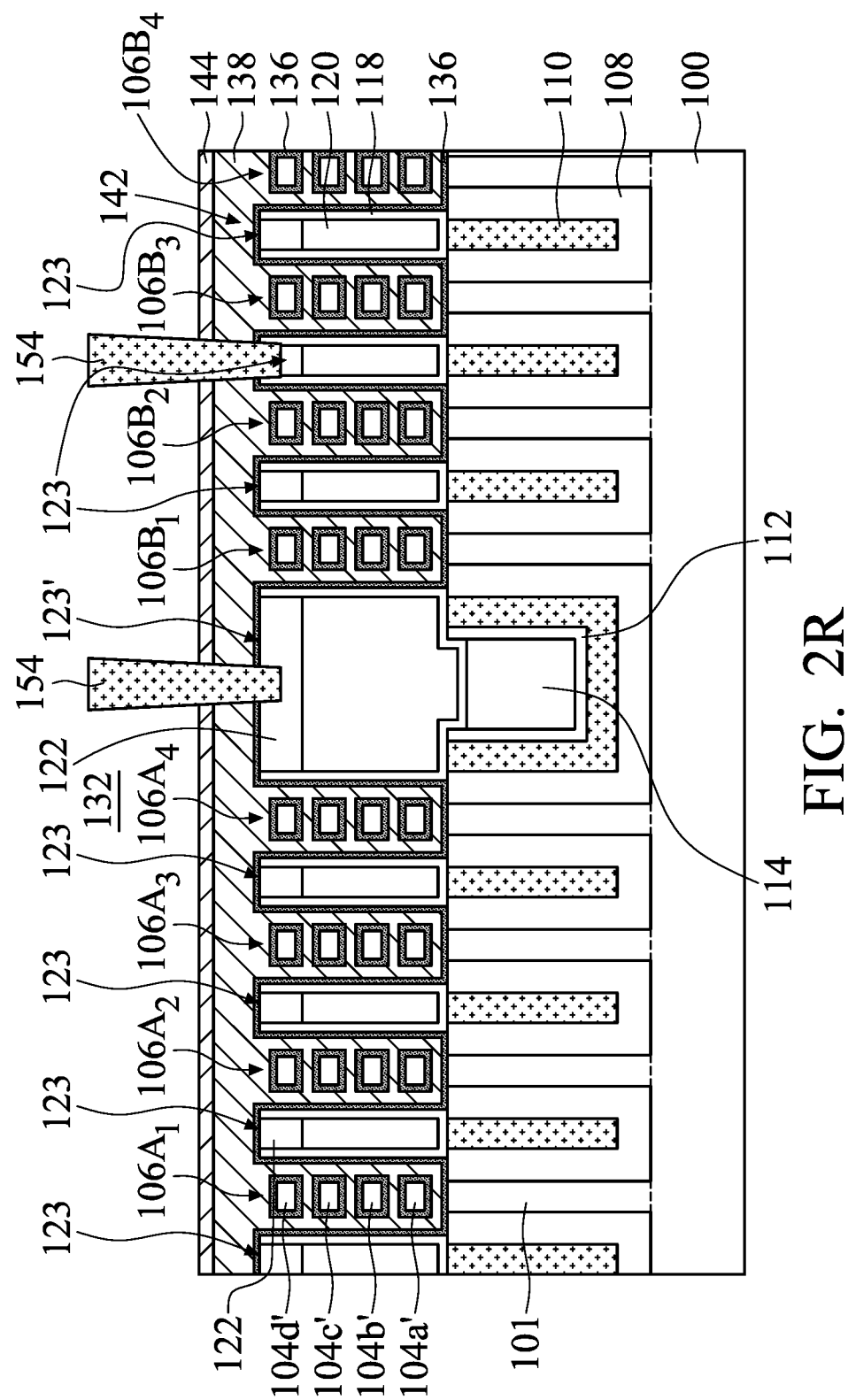
Figure 2S:
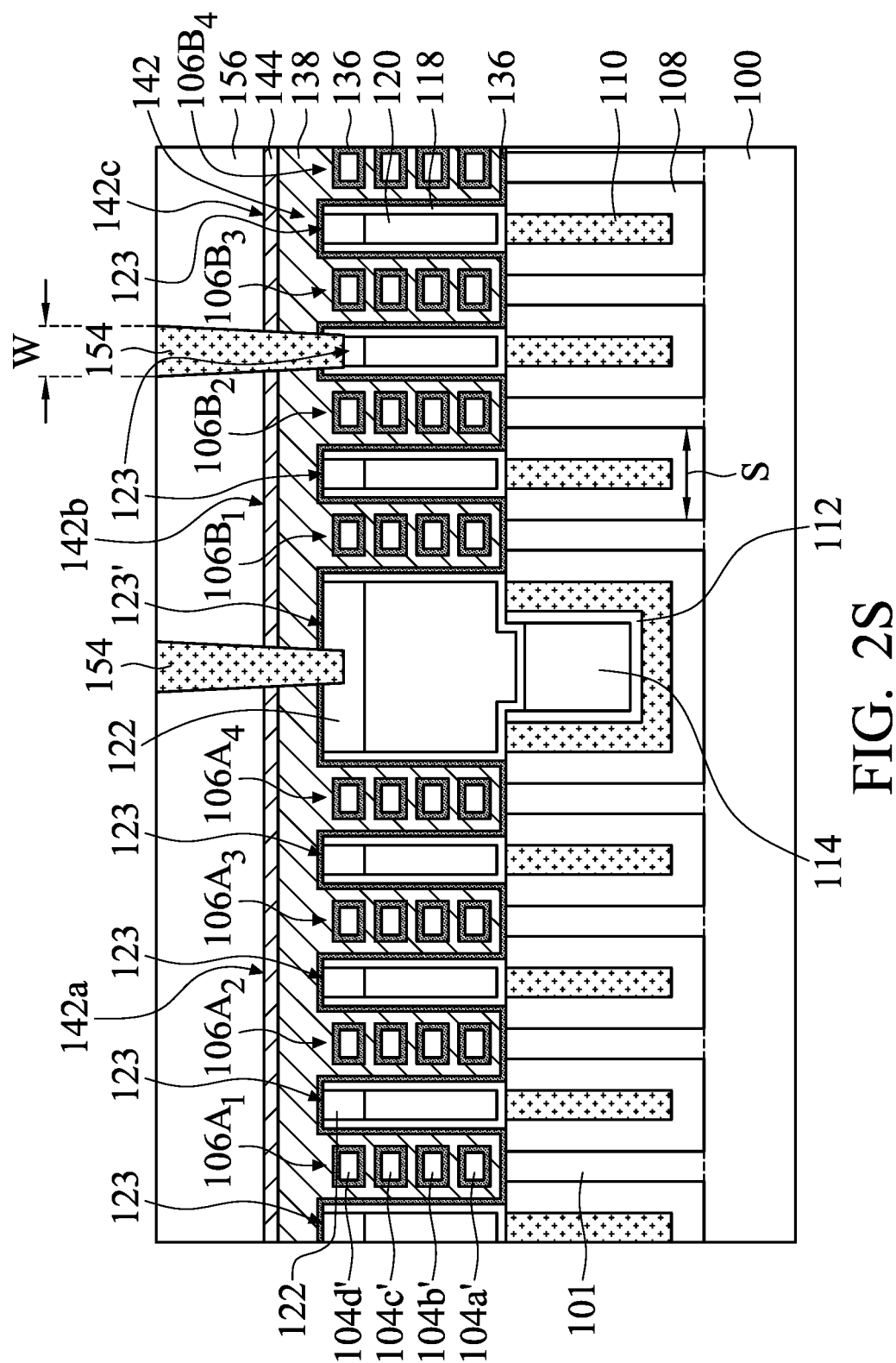

As shown in FIG. 2R, the sacrificial film 146 is removed, in accordance with some embodiments. The sacrificial film 146 may be removed using an etching process. The insulating structures 154 protrude from the top surface of the conductive layer 144. In some embodiments, the insulating structures 154 are positioned in the trench 132, as shown in FIG. 2R.

As shown in FIG. 2S, a dielectric protection structure 156 is formed over the metal gate stack 142 to surround the insulating structures 154, in accordance with some embodiments. In some embodiments, a protection dielectric layer is deposited to overfill the trench 132. The protection dielectric layer may be made of or include silicon nitride, silicon oxynitride, silicon carbide, carbon-containing silicon nitride, carbon-containing silicon oxynitride, one or more other suitable materials, or a combination thereof. The protection dielectric layer may be deposited using a CVD process, an ALD process, an FCVD process, one or more other applicable processes, or a combination thereof.

Afterwards, a planarization process is used to remove the portion of the protection dielectric layer outside of the trench 132. As a result, the remaining portion of the protection dielectric layer in the trench 132 forms the protection dielectric structure 156. The planarization process may include a CMP process, a grinding process, a dry polishing process, an etching process, one or more other applicable processes, or a combination thereof.

In some embodiments, the insulating structure 154 is in direct contact with the dielectric fin 123 or 123', as shown in FIG. 2S. In some embodiments, the insulating structure 154 further extends into the upper portion (i.e., the protection structure 122) of the dielectric fin 123 or 123'. In some embodiments, the metal gate stack 142 has a first part 142a, a second part 142b, and a third part 142c. One of the insulating structures 154 is between the first part 142a and the second part 142b. One of the insulating structures 154 is between the second part 142b and the third part 142c. In some embodiments, due to the electrical isolation provided by the insulating structures 154 and the dielectric fins 123 and 123', the first part 142a, the second part 142b, and the third part 142c are electrically isolated from each other. The metal gate stack is thus cut into multiple parts that are electrically isolated from each other.

The insulating structure 154 and the dielectric fin 123 or 123' together separate the metal gate stack 142 into multiple portions that are electrically isolated from each other. Therefore, the insulating structure 154 does not have to be formed penetrating through the entire metal gate stack 142. The etching loading for forming the "cut metal gate" isolation structures is significantly reduced. In some embodiments, each of the insulating structures 154 is substantially as wide as each other. As shown in FIG. 2S, each of the insulating structures 154 has a top width W. In some embodiments, the top width W is in a range from about 6 nm to about 25 nm.

In some embodiments, the formation of the dielectric fin 123 between two nearby fin structures (such as the fin structure 106B$_1$ and 106B$_2$) mainly involves deposition processes and planarization processes, as illustrated in FIGS. 2F-2H. There is substantially no photolithography process used. Therefore, the spacing S between the two nearby fin structures may be minimized according to the requirement, without being limited by the photolithography process. In some embodiments, the spacing S is in a range from about 20 nm to about 40 nm. Since the spacing between the fin structures is significantly reduced, the device density formed on a semiconductor wafer may be further increased. The fabrication cost and fabrication time are greatly reduced.

In some embodiments, there are four semiconductor nanostructures 104a'-104d' formed. However, embodiments of the disclosure are not limited thereto. Many variations and/or modifications can be made to embodiments of the disclosure. In some embodiments, the total number of the semiconductor nanostructures is greater than four. For example, the total number of the semiconductor nanostructures may be five, six, or seven. In some other embodiments, the total number of the semiconductor nanostructures is smaller than four. For example, the total number of the semiconductor nanostructures may be three, two, or one. The total number of the semiconductor nanostructures (or channel structures) of each semiconductor device structure may be tuned according to the requirement.

Embodiments of the disclosure form fin structures and dielectric fins between these fin structures. The formation of the dielectric fins mainly involves deposition processes and planarization processes without using a photolithography process. Therefore, the spacing between the two nearby fin structures may be minimized. Insulating structures are formed to partially penetrate through the metal gate stack to reach the dielectric fins. The insulating structures and the dielectric fins together cut the metal gate stack into multiple portions that are designed to be electrically isolated from each other. The formation difficulty of the "cut metal gate" isolation structures is significantly reduced. The performance and reliability of the semiconductor device structure are greatly improved.

In accordance with some embodiments, a semiconductor device structure is provided. The semiconductor device structure includes a first fin structure over a semiconductor substrate, and the first fin structure has multiple first semiconductor nanostructures suspended over the semiconductor substrate. The semiconductor device structure also includes a second fin structure over the semiconductor substrate, and the second fin structure has multiple second semiconductor nanostructures suspended over the semiconductor substrate. The semiconductor device structure further includes a dielectric fin between the first fin structure and the second fin structure. In addition, the semiconductor device structure includes a metal gate stack wrapping around the first fin structure, the second fin structure, and the dielectric fin. The semiconductor device structure includes a dielectric protection structure over the metal gate stack. The semiconductor device structure also includes an insulating structure penetrating through a bottom surface of the dielectric protection structure and extending into the metal gate stack to be aligned with the dielectric fin.

In accordance with some embodiments, a semiconductor device structure is provided. The semiconductor device structure includes a fin structure over a semiconductor substrate, and the fin structure has multiple semiconductor nanostructures suspended over the semiconductor substrate. The semiconductor device structure also includes a first dielectric fin and a second dielectric fin over the semiconductor substrate. The fin structure is between the first dielectric fin and the second dielectric fin, and the first dielectric fin is wider than the second dielectric fin. The semiconductor device structure further includes a metal gate stack wrapping around the fin structure. A portion of the metal gate stack is between two of the semiconductor nanostructures. In addition, the semiconductor device structure includes a first insulating structure extending into the metal gate stack to reach the first dielectric fin. The semiconductor device structure includes a second insulating structure extending into the metal gate stack to reach the second dielectric fin. The second insulating structure is substantially as wide as the first dielectric fin.

In accordance with some embodiments, a method for forming a semiconductor device structure is provided. The method includes forming a first fin structure and a second fin structure over a semiconductor substrate. Each of the first fin structure and the second fin structure has multiple sacrificial layers and multiple semiconductor layers laid out alternately. The method also includes forming a dielectric fin to fill a space between the first fin structure and the second fin structure and removing the sacrificial layers to release multiple semiconductor nanostructures constructed by the semiconductor layers. The method further includes forming a metal gate stack to wrap around each of the semiconductor nanostructures. In addition, the method includes forming an insulating structure extending into the metal gate stack and reaching the dielectric fin. The insulating structure and the dielectric fin together separate the metal gate stack into a first part and a second part, and the first part is electrically isolated from the second part.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a first fin structure over a semiconductor substrate, wherein the first fin structure has a plurality of first semiconductor nanostructures suspended over the semiconductor substrate;
a second fin structure over the semiconductor substrate, wherein the second fin structure has a plurality of second semiconductor nanostructures suspended over the semiconductor substrate;
a dielectric fin between the first fin structure and the second fin structure;
a metal gate stack wrapping around the first fin structure, the second fin structure, and the dielectric fin, wherein the metal gate stack has a gate dielectric layer and a gate electrode, and the gate dielectric layer extends along a sidewall and a topmost surface of the dielectric fin;
a dielectric protection structure over the metal gate stack; and
an insulating structure penetrating through a bottom surface of the dielectric protection structure and extending into the metal gate stack to be aligned with the dielectric fin, wherein the insulating structure is in direct contact with the gate electrode.

2. The semiconductor device structure as claimed in claim 1, wherein the insulating structure is in direct contact with the dielectric fin, the metal gate stack has a first portion and a second portion, the insulating structure is between the first portion and the second portion, and the first portion and the second portion are electrically isolated from each other.

3. The semiconductor device structure as claimed in claim 1, wherein the dielectric fin comprises an upper portion and a lower portion, and the upper portion and the lower portion are made of different materials.

4. The semiconductor device structure as claimed in claim 3, wherein the upper portion of the dielectric fin has a first dielectric constant, the lower portion of the dielectric fin has a second dielectric constant, and the first dielectric constant is greater than the second dielectric constant.

5. The semiconductor device structure as claimed in claim 3, wherein the insulating structure extends into the upper portion of the dielectric fin.

6. The semiconductor device structure as claimed in claim 3, wherein the dielectric fin comprises a liner layer extending along sidewalls of the upper portion, sidewalls of the lower portion, and a bottom of the lower portion.

7. The semiconductor device structure as claimed in claim 1, further comprising:
a source/drain structure over the semiconductor substrate; and
an inner spacer between the metal gate stack and the source/drain structure.

8. The semiconductor device structure as claimed in claim 7, wherein the inner spacer wraps around edge portions of each of the first semiconductor nanostructures.

9. The semiconductor device structure as claimed in claim 8, wherein the inner spacer is in direct contact with the dielectric fin.

10. The semiconductor device structure as claimed in claim 1, further comprising a second dielectric fin, wherein the first fin structure is between the dielectric fin and the second dielectric fin, and the second dielectric fin is wider than the dielectric fin.

11. A semiconductor device structure, comprising:
a fin structure over a semiconductor substrate, wherein the fin structure has a plurality of semiconductor nanostructures suspended over the semiconductor substrate;
a first dielectric fin and a second dielectric fin over the semiconductor substrate, wherein the fin structure is between the first dielectric fin and the second dielectric fin, and the first dielectric fin is wider than the second dielectric fin;
a metal gate stack wrapping around the fin structure, wherein a portion of the metal gate stack is between two of the semiconductor nanostructures, the metal gate stack has a gate dielectric layer and a gate electrode, and the gate dielectric layer extends along a sidewall and a topmost surface of the first dielectric fin;
a first insulating structure extending into the metal gate stack to reach the first dielectric fin, wherein a topmost surface of the first insulating structure is higher than a topmost surface of the gate dielectric layer; and
a second insulating structure extending into the metal gate stack to reach the second dielectric fin, wherein the second insulating structure is substantially as wide as the first dielectric fin.

12. The semiconductor device structure as claimed in claim 11, wherein each of the first dielectric fin and the second dielectric fin comprises an upper portion and a lower portion, and the upper portion and the lower portion are made of different materials.

13. The semiconductor device structure as claimed in claim 12, wherein the upper portion has a first dielectric constant, the lower portion has a second dielectric constant, and the first dielectric constant is greater than the second dielectric constant.

14. The semiconductor device structure as claimed in claim 12, wherein the first insulating structure extends into the upper portion of the first dielectric fin.

15. The semiconductor device structure as claimed in claim 12, wherein each of the first dielectric fin and the second dielectric fin comprises a liner layer extending along sidewalls of the upper portion, sidewalls of the lower portion, and a bottom of the lower portion.

16. A semiconductor device structure, comprising:
a first fin structure over a semiconductor substrate;

a second fin structure over the semiconductor substrate;

a dielectric fin between the first fin structure and the second fin structure;

a metal gate stack over the first fin structure, the second fin structure, and the dielectric fin, wherein the metal gate stack has a gate dielectric layer and a gate electrode, and the gate dielectric layer extends along a sidewall and a topmost surface of the dielectric fin;

a dielectric protection structure over the metal gate stack; and an insulating structure penetrating through a bottom surface of the dielectric protection structure and extending into the metal gate stack to be aligned with the dielectric fin, wherein a topmost surface of the insulating structure is higher than a topmost surface of the gate dielectric layer.

17. The semiconductor device structure as claimed in claim 16, further comprising a second dielectric fin, wherein the first fin structure is between the dielectric fin and the second dielectric fin, and the second dielectric fin is wider than the dielectric fin.

18. The semiconductor device structure as claimed in claim 17, further comprising a second insulating structure extending into the metal gate stack to reach the second dielectric fin.

19. The semiconductor device structure as claimed in claim 18, wherein the second insulating structure is substantially as wide as the first dielectric fin.

20. The semiconductor device structure as claimed in claim 16, wherein the insulating structure is in direct contact with the dielectric fin.

* * * * *